United States Patent
Hong et al.

(10) Patent No.: US 10,503,307 B2
(45) Date of Patent: Dec. 10, 2019

(54) FLEXIBLE DISPLAY DEVICE AND DRIVING METHOD THEREOF

(71) Applicant: SAMSUNG DISPLAY CO., LTD., Yongin-si, Gyeonggi-do (KR)

(72) Inventors: Won-ki Hong, Gyeonggi-do (KR); Beomshik Kim, Yongin-si (KR); Jongseo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 101 days.

(21) Appl. No.: 15/196,517

(22) Filed: Jun. 29, 2016

(65) Prior Publication Data

US 2017/0123558 A1 May 4, 2017

(30) Foreign Application Priority Data

Nov. 4, 2015 (KR) ........................ 10-2015-0154599

(51) Int. Cl.
*G06F 1/16* (2006.01)
*G06F 3/041* (2006.01)
(Continued)

(52) U.S. Cl.
CPC .......... *G06F 3/0416* (2013.01); *G06F 1/1641* (2013.01); *G06F 1/1652* (2013.01);
(Continued)

(58) Field of Classification Search
CPC ................ G06F 1/1652; G06F 1/1684; G06F 2203/04102; G06F 2203/04104;
(Continued)

(56) References Cited

U.S. PATENT DOCUMENTS 8,502,788 B2  8/2013  Cho
8,829,368 B2 *  9/2014  Hinata .................... G06F 3/045
                                                      178/18.05
(Continued)

FOREIGN PATENT DOCUMENTS

JP          2014-006892 A    1/2014
KR    10-2013-0113901 A    10/2013
(Continued)

*Primary Examiner* — Dismery Mercedes
(74) *Attorney, Agent, or Firm* — Lewis Roca Rothgerber Christie LLP

(57) ABSTRACT

A flexible display device includes a flexible display panel to generate an image and a bending detection screen to detect a bending angle and a bending position. The bending detection screen includes an angle detection sensor and a position detection sensor. The angle detection sensor includes a material with a resistance that changes in correspondence to an intensity of an applied stress. The angle detection sensor has an area per unit length that is substantially constant on a base surface. The position detection sensor includes a material with a resistance that changes in correspondence to an intensity of the applied stress. The position detection sensor has an area per unit length that increases along a length direction on the base surface. Signal lines are connected to the angle and position detection sensors.

20 Claims, 19 Drawing Sheets

(51) Int. Cl.
*G09G 5/00* (2006.01)
*G06F 3/045* (2006.01)
*H01L 27/32* (2006.01)
*G09G 3/3258* (2016.01)
*G09G 3/3266* (2016.01)
*G09G 3/3291* (2016.01)
*G09G 3/00* (2006.01)
*H01L 51/00* (2006.01)

(52) U.S. Cl.
CPC ............ *G06F 3/045* (2013.01); *G06F 3/0412* (2013.01); *G06F 3/0414* (2013.01); *G09G 3/001* (2013.01); *G09G 3/3258* (2013.01); *G09G 3/3266* (2013.01); *G09G 3/3291* (2013.01); *H01L 27/3276* (2013.01); *G06F 2203/04102* (2013.01); *G06F 2203/04103* (2013.01); *G09G 2380/02* (2013.01); *H01L 51/0097* (2013.01)

(58) Field of Classification Search
CPC ........ G06F 3/041; G06F 3/0414; G06F 3/045; G06F 1/1616; G06F 1/1641; G06F 2203/04105; G06F 3/0416; G06F 3/0412; G09G 2380/02; H01L 2251/5338; H01L 51/0097; H01L 27/3276; H01L 27/323
See application file for complete search history.

(56) References Cited

U.S. PATENT DOCUMENTS

| | | | | |
|---|---|---|---|---|
| 9,256,298 | B2* | 2/2016 | Zhou | G09G 3/20 |
| 9,436,224 | B2* | 9/2016 | Jeong | G06F 1/1652 |
| 9,476,704 | B2* | 10/2016 | Choi | G01B 21/22 |
| 9,557,862 | B2* | 1/2017 | Ho | G06F 3/0416 |
| 2007/0247443 | A1* | 10/2007 | Philipp | G06F 3/044 345/173 |
| 2008/0252608 | A1* | 10/2008 | Geaghan | G06F 3/044 345/173 |
| 2009/0219247 | A1* | 9/2009 | Watanabe | G06F 1/1615 345/157 |
| 2012/0256720 | A1* | 10/2012 | Byun | H01C 10/10 338/2 |
| 2013/0082973 | A1* | 4/2013 | Wurzel | G06F 3/044 345/174 |
| 2014/0101560 | A1* | 4/2014 | Kwak | G06F 1/1652 715/738 |
| 2014/0104166 | A1 | 4/2014 | Kim | |
| 2014/0152579 | A1* | 6/2014 | Frey | G06F 3/044 345/173 |
| 2014/0204285 | A1* | 7/2014 | Jang | G06F 3/044 349/12 |
| 2014/0331781 | A1* | 11/2014 | Lee | G01N 3/20 73/849 |
| 2016/0034104 | A1* | 2/2016 | Lee | G06F 3/044 345/173 |
| 2016/0378249 | A1* | 12/2016 | Miura | G06F 3/0416 345/174 |
| 2017/0060189 | A1* | 3/2017 | Sohn | G06F 1/1652 |

FOREIGN PATENT DOCUMENTS

| | | |
|---|---|---|
| KR | 10-2013-0140408 A | 12/2013 |
| KR | 10-2014-0022180 A | 2/2014 |
| KR | 10-2014-0028257 A | 3/2014 |
| KR | 10-2014-0048007 A | 4/2014 |
| KR | 10-2014-0069302 A | 6/2014 |
| KR | 10-2015-0019037 A | 2/2015 |

* cited by examiner

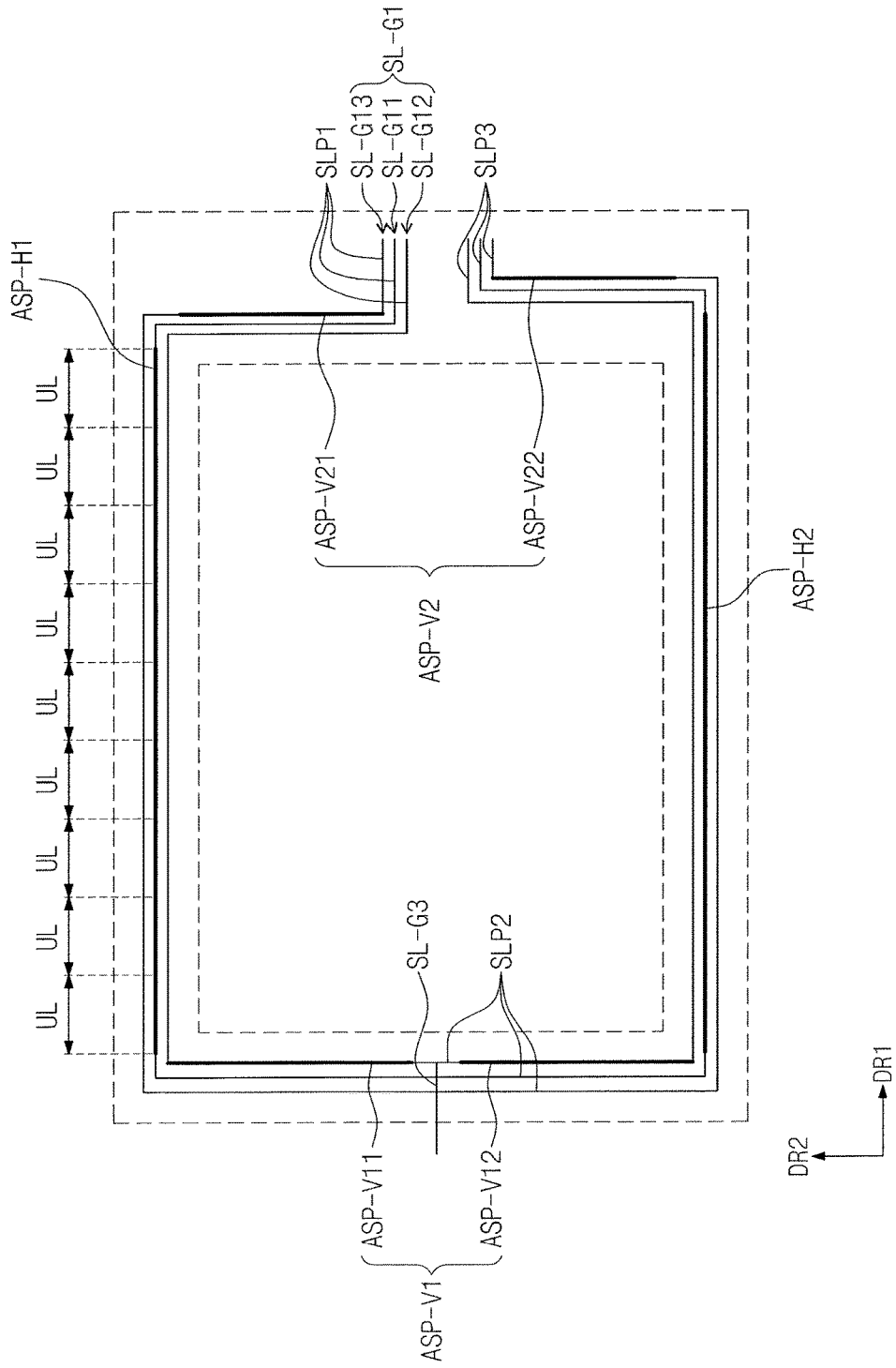

FLEXIBLE DISPLAY DEVICE AND DRIVING METHOD THEREOF

CROSS-REFERENCE TO RELATED APPLICATION

Korean Patent Application No. 10-2015-0154599, filed on Nov. 4, 2015, and entitled, "Flexible Display Device and Driving Method Thereof," is incorporated by reference herein in its entirety.

BACKGROUND

1. Field

One or more embodiments described herein relate to a flexible display device and a method for driving a flexible display device.

2. Description of the Related Art

Various display devices have been developed for electronic products, including but not limited to televisions, mobile phones, tablet computers, navigations, and game consoles. These products may include one or more input devices, e.g., keyboard, mouse, and touch panel. Some display devices curve, bend, fold, roll, or stretch.

SUMMARY

In accordance with one or more embodiments, a flexible display device includes a flexible display panel to generate an image; and a bending detection screen to detect a bending angle and a bending position, wherein the bending detection screen includes: an angle detection sensor including a material with a resistance that changes in correspondence to an intensity of an applied stress, the angle detection sensor having an area per unit length that is substantially constant on a base surface; an position detection sensor including a material with a resistance that changes in correspondence to an intensity of the applied stress, the position detection sensor having an area per unit length that increases along a length direction on the base surface; and signal lines connected to the angle and position detection sensors.

The angle detection sensor may include an angle detection horizontal sensor extending in a first direction; and an angle detection vertical sensor extending in a second direction intersecting the first direction. The angle detection horizontal sensor may include first and second angle detection horizontal sensors, each of the first and the second angle detection horizontal sensors may extend in the first direction and the first and the second angle detection horizontal sensors may be spaced apart from each other in the second direction; and the angle detection vertical sensor may include first and second angle detection vertical sensors, each of the first and the second angle detection vertical sensors may extend in the second direction and the first and the second angle detection vertical sensors may be spaced apart from each other in the first direction.

Each of the first and second angle detection vertical sensors may include a first sub detection sensor and a second sub detection sensor, each of the first sub detection sensor and the second sub detection sensor may extend in the second direction, and the first sub detection sensor and the second sub detection sensor may be spaced apart from each other in the second direction.

The signal lines may include at least one first signal line to provide a driving voltage to the first and second angle detection horizontal sensors and the first and second angle detection vertical sensors; and second signal lines respectively connected to the first and second angle detection horizontal sensors and the first and second angle detection vertical sensors.

The position detection sensor may include first and second position detection horizontal sensors, each of the first and second position detection horizontal sensors may extend in the first direction, the first and second position detection horizontal sensors may be spaced apart from each other in the second direction; and first and second position detection vertical sensors, each of the first and second position detection vertical sensors may extend in the second direction, the first and second position detection vertical sensors may be spaced apart from each other in the first direction.

The signal lines may include at least one first signal line to provide a driving voltage to the first and second position detection horizontal sensors and the first and second position detection vertical sensors; and second signal lines respectively connected to the first and second position detection horizontal sensors and the first and second position detection vertical sensors. The first signal line may be commonly connected to ends of the first and second position detection horizontal sensors and the first and second position detection vertical sensors. A width of the first position detection horizontal sensor may increase linearly in the first direction.

The first horizontal detection sensor may include an ith sensor portion, an i+1th sensor portion having a larger area than the ith sensor portion, and connection lines connecting the ith sensor portion and the i+1th sensor portion.

The first position detection horizontal sensor may include k sensor portions having different lengths from each other in the first direction and arranged in the second direction, and k−1 connection lines connecting the k sensor portions, wherein ends of the k sensor portions are arranged on a reference line; and an ith connection line among the k−1 connection lines connects an end of an ith sensor portion among the k sensor portions and an end of an i+1th sensor portion, and an i+1th connection line among the k−1 connection lines connects the other end of the i+1th sensor portion among the k sensor portions and one end of an i+2th sensor portion.

Each of the k sensor portions may have an area per unit length that is substantially constant. The bending detection screen may include a flexible base member having the base surface. The angle detection sensor, the position detection sensor, and the signal lines may be on a same surface. The display panel may provide the base surface, and the angle detection sensor, the position detection sensor, and the signal lines are on a same surface.

The flexible display device may include a window to provide an input surface of an input device, wherein the window includes a black matrix partially overlapping a base. The angle detection sensor, the position detection sensor, and the signal lines may overlap the black matrix.

In accordance with one or more other embodiments, a method for driving a display device includes measuring a resistance change value of an angle detection sensor, the angle detection sensor including a material with a resistance that changes in correspondence to intensity of an applied stress and having an area per unit length that is substantially constant; measuring a resistance change value of one or more position detection sensors, each of the one or more position detection sensors including a material with a resistance that changes in correspondence to intensity of the applied stress and having an area per unit length that is increased along a length direction; calculating a bending angle of a bending event based on the resistance change value of the angle detection sensor; and calculating a bending position of the bending event based on the resistance change value of the angle detection sensor and a resistance change value of the position detection sensors.

The method may include re-measuring the resistance change values of the angle detection sensor and the position detection sensor; determining an occurrence of an additional bending event based on the re-measured resistance change values; and calculating a bending angle and a bending position of an additional bending event based on the re-measured resistance change values.

The position detection sensor may include first and second position detection horizontal sensors, each of the first and second position detection horizontal sensors extending in a first direction and the first and second position detection horizontal sensors spaced in a second direction intersecting the first direction; and first and second position detection vertical sensors, each of the first and second position detection vertical sensors extending in the second direction and the first and second position detection vertical sensors spaced apart from each other in the first direction, and the method may include measuring of the resistance change value of the position detection sensors includes simultaneously measuring resistance change values of the first and second position detection horizontal sensors and the first and second position detection vertical sensors.

BRIEF DESCRIPTION OF THE DRAWINGS

Features will become apparent to those of skill in the art by describing in detail exemplary embodiments with reference to the attached drawings in which:

FIG. 6A illustrates an embodiment of an angle detection sensor and FIG. 6B illustrates an example of a resistance change rate of the angle detection sensor according to bending angle;

DETAILED DESCRIPTION

Figure 1A:
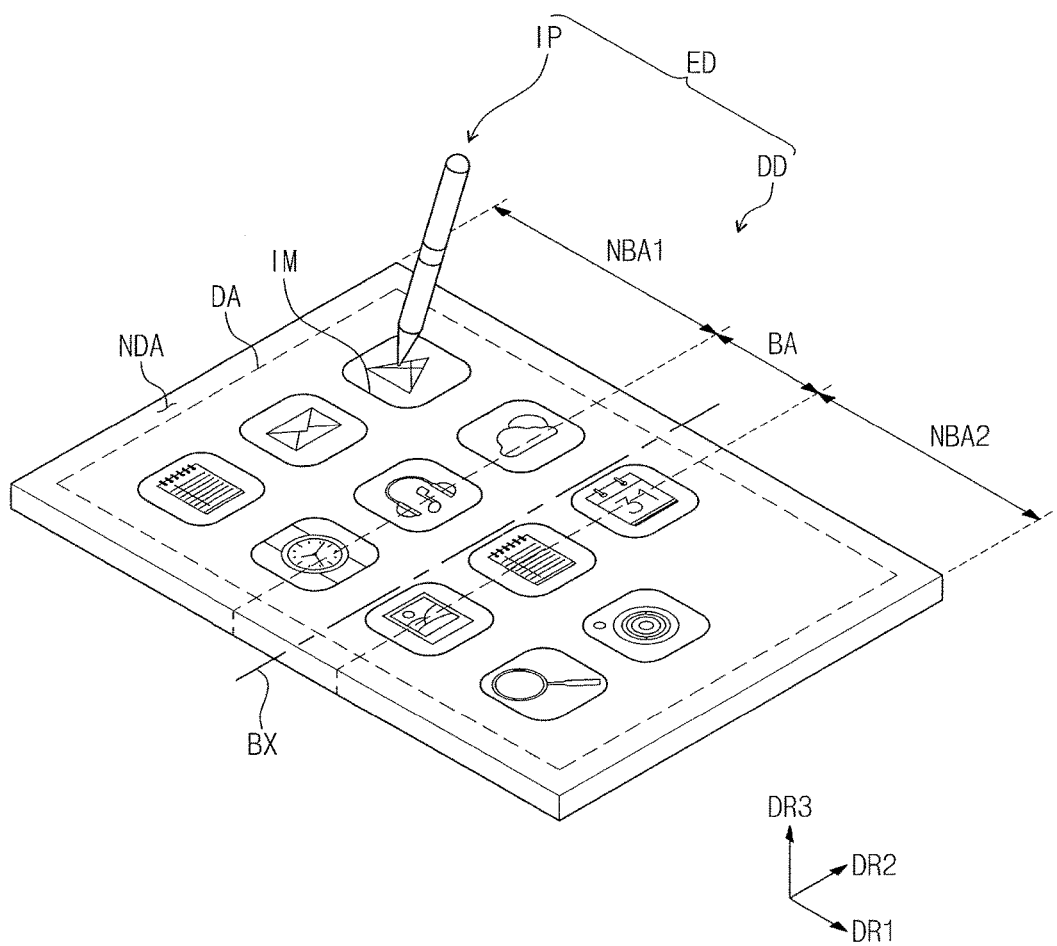
FIGS. 1A and 1B illustrate an embodiment of a flexible display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1B:
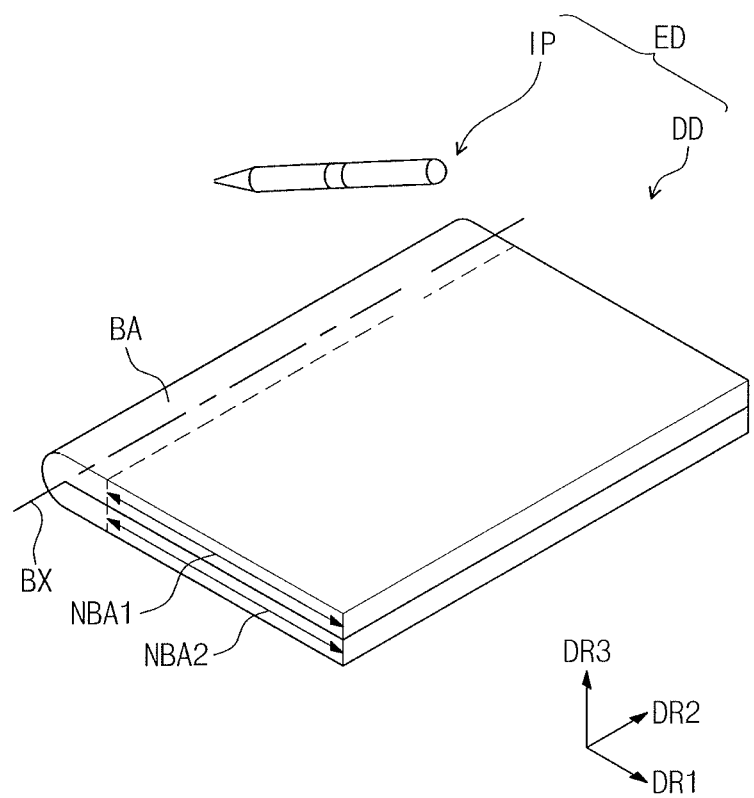

FIGS. 1A and 1B are perspective views of one embodiment of an electronic device ED. In this embodiment, the electronic device ED may include a bendable display device DD and an input pen IP. In this embodiment, the flexible display device DD is a bendable display device DD that folds. In another embodiment, the flexible display device DD may be another type of bendable flexible display device DD, e.g., one that rolls, curve, bends, or stretches.

According to one embodiment, the electronic device ED may be a small and medium-sized electronic device such as but not limited to a mobile phone, personal computer, notebook computer, personal digital assistant, vehicle navigation, game console, portable electronic device, wrist watch type electronic device, and camera in addition to a large-sized electronic device such as a television or monitor.

As shown in FIGS. 1A and 1B, a display surface for displaying an image IM is parallel to a surface or plane defined by a first direction axis DR1 and a second direction axis DR2. A third direction axis DR3 is normal to the display surface. The third direction axis DR3 indicates thickness direction of the flexible display device DD. The front and rear surfaces of each member are divided by the third direction axis DR3. The direction axes DR1, DR2, and DR3 may extend in different directions in another embodiment.

As shown in FIGS. 1A and 1B, the display device DD includes a plurality of areas divided on the display surface. The display device DD may be divided into a display area DA and a non-display area NDA depending on whether the image IM is displayed. The display area DA displays an image and the non-display area NDA is adjacent to the display area DA and does not display an image. According to one embodiment, the display area DA has a predetermined shape, e.g., rectangular. The non-display area NDA may surround the display area DA. FIG. 1A illustrates a plurality of icon images IM as one example of the image IM.

As shown in FIGS. 1A and 1B, the display device DD may include a bending area BA that bends, or folds, along a bending axis BX. The display device also includes a first non-bending area NBA1 and a second non-bending area NBA2. The first non-bending area NBA1 and the second non-bending area NBA2 may face each other when the display device DD folds along the bending axis BX. The first non-bending area NBA1 and the second non-bending area NBA2 may be in, for example, a same plane when the display device DD is unfolded.

In one embodiment, the display device DD may include a plurality of bending areas BA. Moreover, each bending area BA may be defined in correspondence to a form that a user manipulates the display device DD. For example, each bending area BA may be parallel to the first direction axis DR1. In one embodiment one or more of the bending areas may be in a diagonal direction.

The input pen IP may touch one of the icon images IM, for example, when the display device DD is unfolded. In this embodiment, inputting predetermined information using the input pen IP is defined as "touch input." FIGS. 1A and 1B illustrate that an input device of the display device is an input pen. In another embodiment, a different type of input device may be included. For example, the input device may be an active-type or a passive-type device. In one embodiment, the input pen IP may be omitted.

Figure 2A:
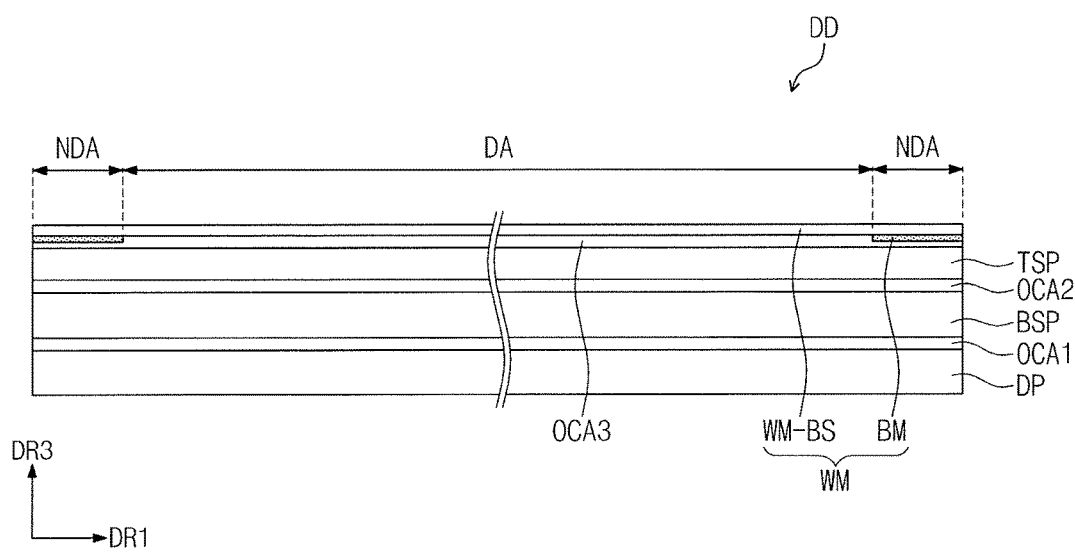
FIGS. 2A and 2B illustrate sectional views the flexible display device.
Figure 2B:
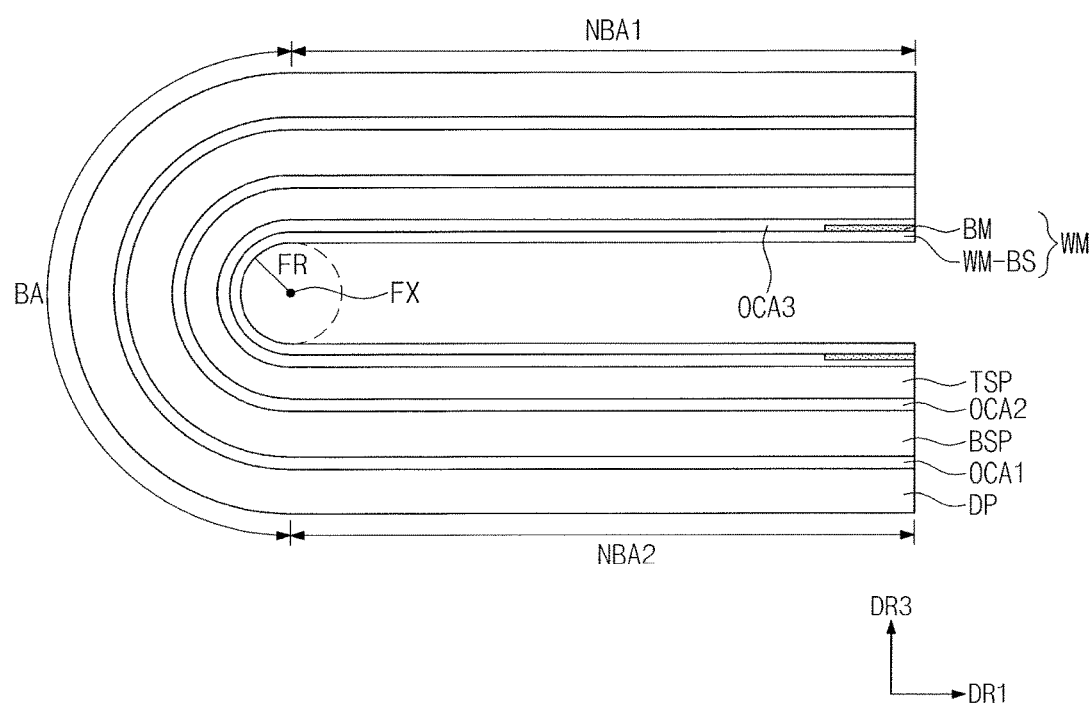

FIGS. 2A and 2B are enlarged sectional views of the display device DD. As shown in FIGS. 2A and 2B, the display device DD includes a display panel DP, a bending detection screen BSP, a touch panel TSP, and a window member WM. Each of the display panel DP, the bending detection screen BSP, the touch panel TSP, and the window member WM may have a flexible property. The display device DD may further include a protection member coupled to the window member WM to protect the display panel DP and the touch panel TSP. According to one embodiment, the touch panel TSP may be omitted or may be integrated with the bending detection screen BSP.

The display panel DP generates an image 1M (see, e.g., FIG. 1A) corresponding to input image data. The display panel DP may be, for example, an organic light emitting display panel, an electrophoretic display panel, or an electrowetting display panel. For illustrative purposes, an organic light emitting display panel is described.

The bending detection screen BSP detects a bending angle and a bending position. The bending detection screen BSP includes a plurality of sensors, each of which includes a material with a resistance that changes in correspondence to intensity of applied stress. A plurality of signal lines are electrically connected to the sensors.

The touch panel TSP obtains coordinate information of an external input. The touch panel TSP may be on the front surface (or another surface) of the bending detection screen BSP. The touch panel TSP may be, for example, a capacitive type, a resistive layer type, an electromagnetic induction type, or a pressure detection type.

The window member WM includes a base member WM-BS and a black matrix BM. The black matrix BM may partially overlap the base member WM-BS. The black matrix BM may be at the rear surface of the base member WM-BS to define a bezel area of the display device DD, e.g., the non-display area NDA (see, e.g., FIG. 1A). The base member WM-BS may include, for example, a glass substrate, a sapphire substrate, or a plastic film. The black matrix BM may include a colored organic layer formed, for example, through a coating method. The window member WM may further include a functional coating layer at the front surface of the base member WM-BS. The functional coating layer may include, for example, an anti-fingerprint layer, anti-reflective layer, and/or a hard coating layer.

The display panel DP and the bending detection screen BSP may be coupled to each other, for example, by an optically clear Adhesive film OCA1. The bending detection screen BSP and the touch panel TSP may be coupled to each other, for example, by an optically clear Adhesive film OCA2. The touch panel TSP and the window member WM may be also coupled to each other, for example, by an optically clear Adhesive film OCA3. According to an embodiment, one of the three optically clear Adhesive films OCA1, OCA2, and OCA3 may be omitted. As the display panel DP and the bending detection screen BSP are manufactured through a continuous process, the bending detection screen BSP may be directly on the display panel DP. Because the bending detection screen BSP and the touch panel TSP are manufactured through a continuous process, the touch panel TSP may be directly disposed on the bending detection screen BSP.

Figure 3:
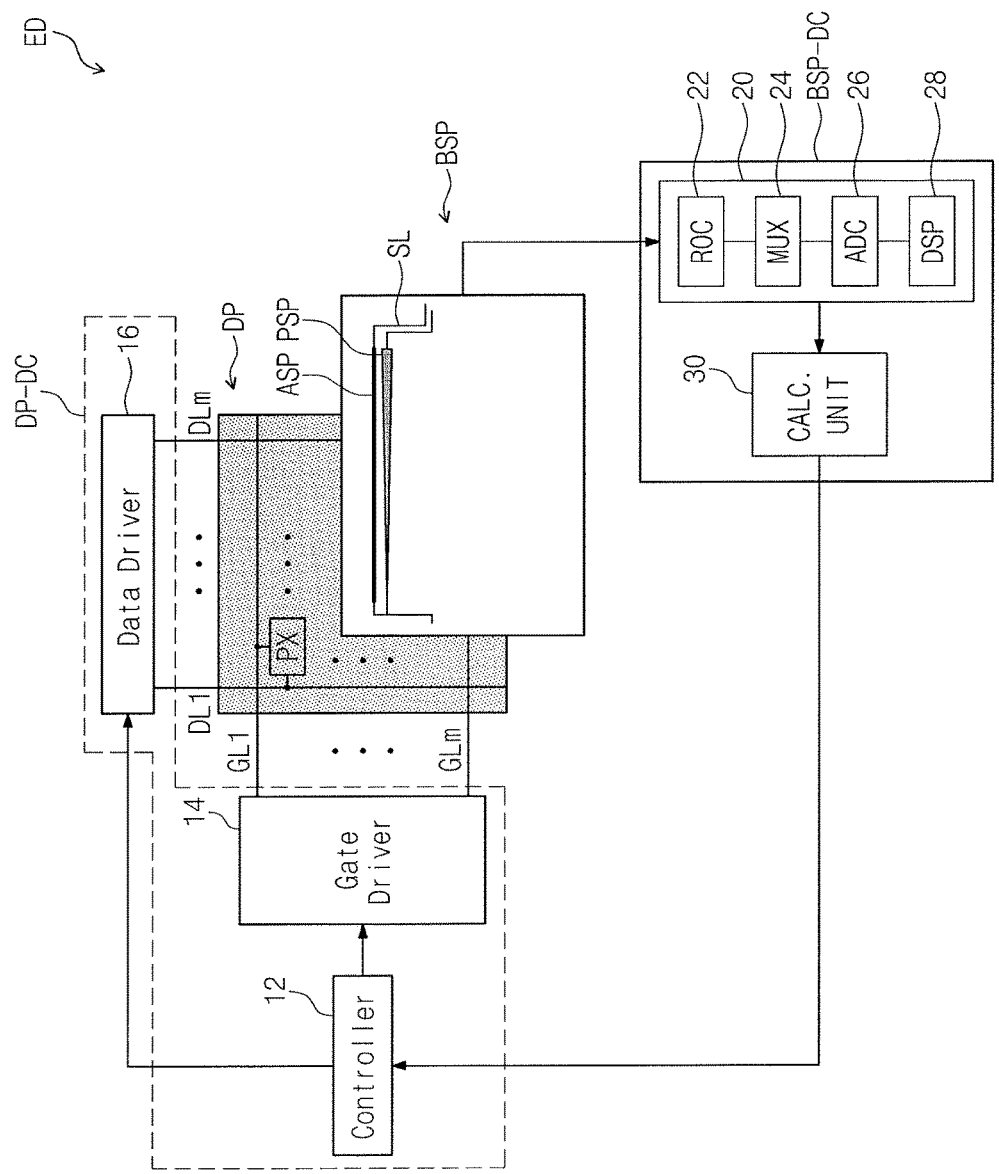
FIG. 3 illustrates an embodiment of a flexible display device.

FIG. 3 illustrates an embodiment of an electronic device ED which includes a driving circuit DP-DC (e.g., a display panel driving circuit) for driving the display panel DP and a driving circuit BSP-DC (e.g., bending detection circuit) for driving the bending detection screen BSP.

The display panel DP may include a plurality of gate lines GL1 to GLn, a plurality of data lines DL1 to DLm, and a plurality of pixels PX. The display panel driving circuit DP-DC may include a controller 12, a gate driver 14, and a data driver 16. The controller 12 receives input image signals and converts the input image signals to image data corresponding to an operation mode of the display panel DP. Additionally, the timing controller 12 receives various control signals (e.g., a vertical sync signal, a horizontal sync signal, a main clock signal, and a data enable signal) and outputs a gate control signal and a data control signal.

The controller 12 receives information on the bending angle and bending position from the bending detection circuit BSP-DC and executes various applications based on the information. The gate driver 14 outputs gate signals to the gate lines GL1 to GLn. The data driver 16 outputs data signals to the data lines DL1 to DLm. The display panel driving circuit DP-DC may further include a power voltage providing circuit to provide a power voltage for operating the display panel DP, the controller 12, the gate driver 14, and the data driver 16.

The bending detection screen BSP includes an angle detection sensor ASP, a position detection sensor PSP, and signals lines SL connected to the sensors ASP and PSP. Each of the angle detection sensor ASP and the position detection sensor PSP may include materials with a resistance that changes in correspondence to the intensity of applied pressure. The materials of the sensors ASP and PSP may include, for example, piezo-electric materials, carbon powder, Quantum Tunneling Composite (QTC), silver nano particles, single crystal or polycrystalline silicon, carbon nanotubes, and graphene. Each of the sensors ASP and PSP may include a material selected from the above-mentioned materials or may include the same material.

The signal lines SL may include a high conducive material, for example, gold, silver, copper, aluminum, and/or alloys thereof. The signal lines SL may have a single-layer or multi-layer structure including the above-mentioned material.

The bending detection circuit BSP-DC may include a current detection unit 20 for detecting resistance change values of the sensors ASP and PSP and a calculation unit 30 for calculating the bending angle and bending position from the resistance change values. The bending detection circuit BSP-DC may further include a driving voltage providing circuit to provide a predetermined driving voltage to the sensors ASP and PSP.

The current detection unit 20 may include a readout circuit (ROC) 22 for reading respective current values of the sensors ASP and PSP, a multiplexer (MUX) 24 for outputting the current values received from the readout circuit 22 in correspondence to unique codes of the sensors ASP and PSP, an analog-digital converter (ADC) 26 for converting analog signals received from the multiplexer 24 into digital signals, and a digital signal processor (DSP) 28 for calculating information on resistance change values of each of the sensors ASP and PSP from the converted digital signals.

The calculation unit 30 calculates bending angle based on a resistance change value of the angle detection sensor ASP and calculates bending position based on a resistance change value of the angle detection sensor ASP and a resistance change value of the position detection sensor PSP. The calculation unit 30 may read information on a bending angle according to a resistance change value of the angle detection sensor ASP, for example, from a look-up table stored in a memory. The calculation unit 30 may read information on bending position according to a resistance change value of the position detection sensor PSP, for example, from a look-up table stored in a memory. The bending positions according to resistance change values of the position detection sensor PSP may be separately stored for corresponding bending angles. The calculation unit 30 provides bending angle information and bending position information to controller 12.

Figure 4:
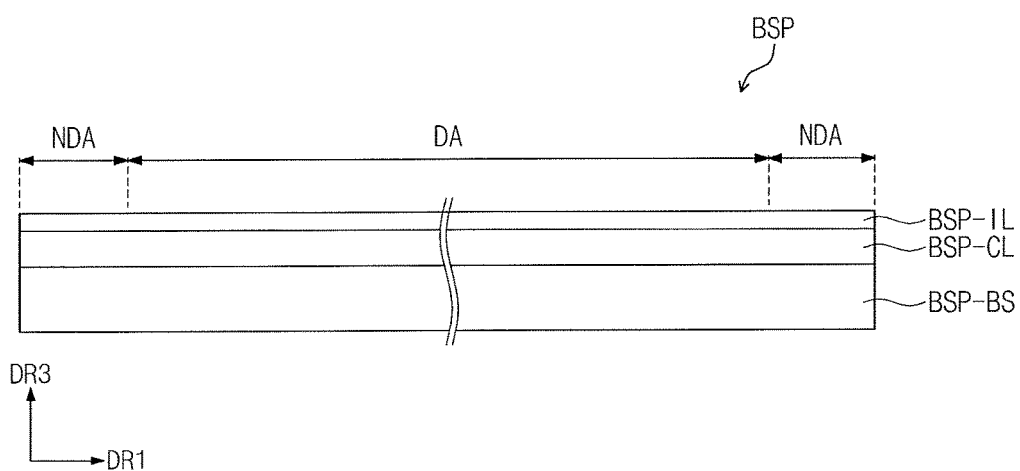
FIG. 4 illustrates an embodiment of a bending detection screen.
Figure 5:
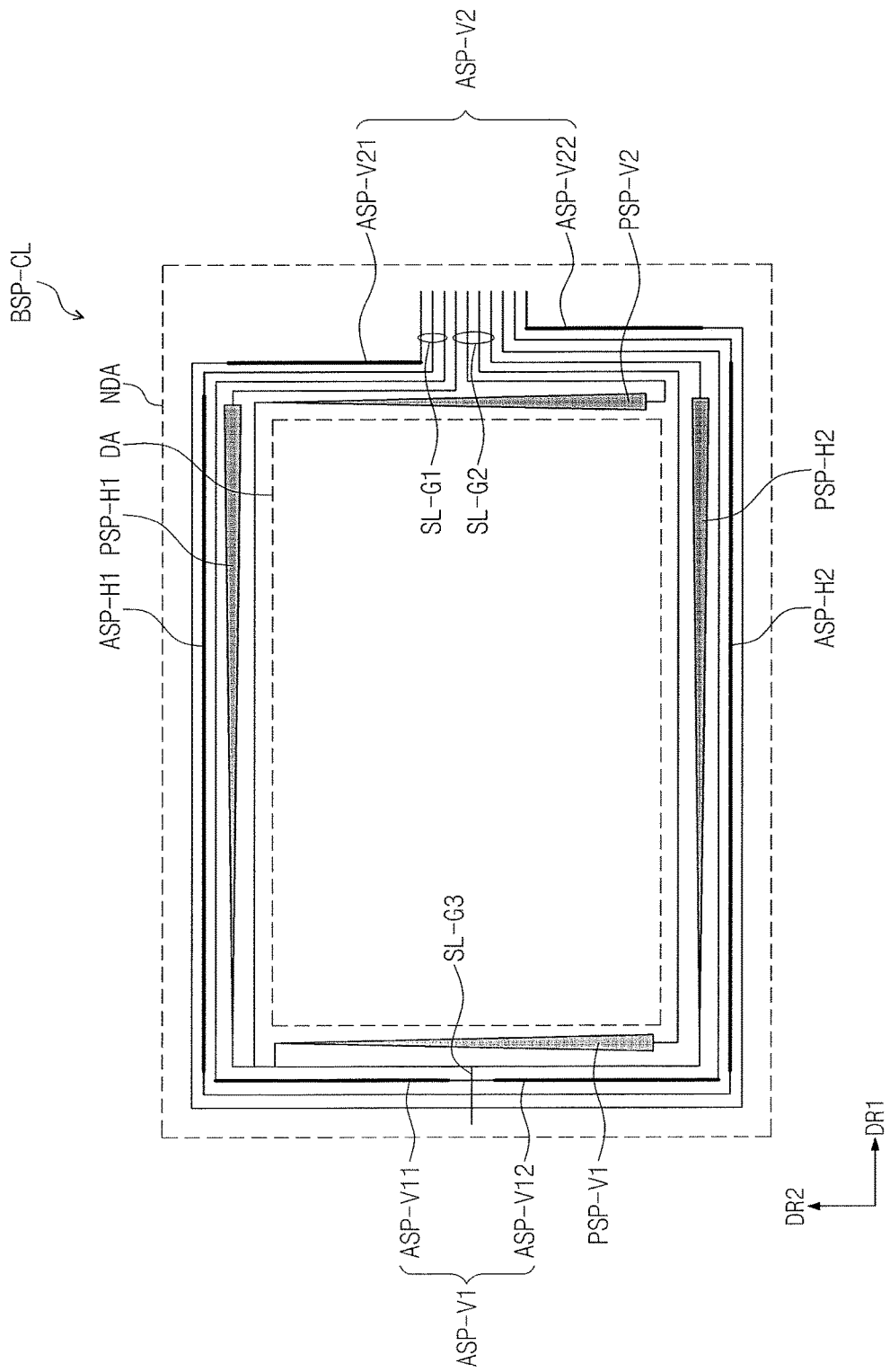
FIG. 5 illustrates another view of the bending detection screen.

FIG. 4 is a sectional view of an embodiment of the bending detection screen BSP, and FIG. 5 is a plan view of the bending detection screen. Referring to FIG. 4, the bending detection screen BSP includes a base member BSP-BS, a conductive layer BSP-CL, and an insulation layer BSP-IL. According to one embodiment, a buffer layer may be disposed between the base member BSP-BS and the conductive layer BSP-CL. The base member BSP-BS or the buffer layer may provide a base surface. The base member BSP-BS may include at least one of Polyimide (PI), Polyethyleneterephthalate (PET), Polyethylenenaphthalate (PEN), Polyethersulphone (PES), or Fiber reinforced plastics (FRP). In one embodiment, the base member BSP-BS may be omitted.

The conductive layer BSP-CL may include materials with resistances that change in correspondence to applied stress and high conductive materials, e.g., gold, silver, copper, aluminum, or alloys thereof. The conductive layer BSP-CL may be patterned into the angle detection sensor ASP, the position detection sensor PSP, and the signals lines SL (see, e.g., FIG. 3) through several cycles of a photolithography process. As a result, the angle detection sensor ASP, the position detection sensor PSP, and the signal lines SL may be disposed on the same surface, for example, the base surface.

The insulation layer BSP-IL may protect the angle detection sensor ASP, the position detection sensor PSP, and the signal lines SL and/or may insulate some conductive patterns from other conductive patterns. The insulation layer BSP-IL may include at least one of an inorganic layer or an organic layer. The insulation layer BSP-IL may have a multilayer structure and may include at least one inorganic layer and at least one organic layer.

FIG. 5 illustrates an embodiment of the angle detection sensor ASP, the position detection sensor PSP, and the signals lines SL (see, e.g., FIG. 3). As illustrated in FIG. 5, the angle detection sensor ASP, the position detection sensor PSP, and the signal lines SL may be in a non-display area NDA.

The angle detection sensor ASP may include angle detection horizontal sensors ASP-H1 and ASP-H2 extending in a first direction DR1 and angle detection vertical sensors ASP-V1 and ASP-V2 extending in a second direction DR2 intersecting the first direction DR1. The first and second angle detection horizontal sensors ASP-H1 and ASP-H2 are spaced in the second direction DR2, and the first and second angle detection vertical sensors ASP-V1 and ASP-V2 are spaced in the first direction DR1. The sensors may disposed in a different arrangement in another embodiment.

In one embodiment, the first angle detection vertical sensor ASP-V1 may include sub detection sensors ASP-V11 and ASP-V12 spaced along the second direction DR2. The second angle detection vertical sensor ASP-V2 may include sub detection sensors ASP-V21 and ASP-V22 spaced along the second direction DR2.

The position detection sensor PSP may include position detection horizontal sensors PSP-H1 and PSP-H2 extending in the first direction DR1 and position detection vertical sensors PSP-V1 and PSP-V2 extending in the second direction DR2 intersecting the first direction DR1. The first and second position detection horizontal sensors PSP-H1 and PSP-H2 are spaced in the second direction DR2. The first and second position detection vertical sensors PSP-V1 and PSP-V2 are spaced in the first direction DR1.

The signals lines SL may include a first signal line group SL-G1 connected to the angle detection sensor ASP, a second signal line group SL-G2 connected to the position detection sensor PSP, and a third signal line group SL-G3 for providing a driving voltage to the angle detection sensor ASP and the position detection sensor PSP.

Figure 6B:
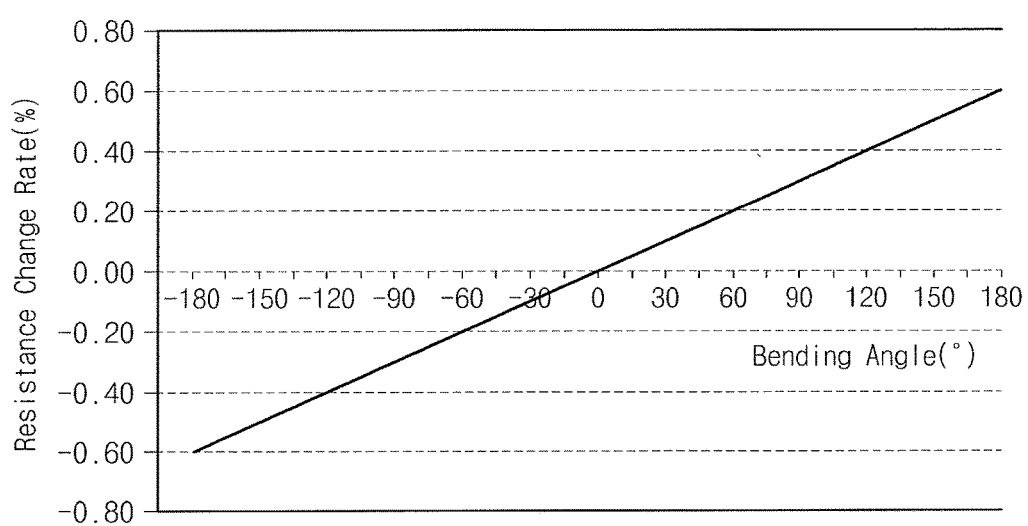

FIG. 6A is a plan view illustrating an embodiment of the angle detection sensors ASP-H1, ASP-H2, ASP-V1, and ASP-V2. FIG. 6B is a graph illustrating an example of a resistance change rate according to bending angle of the angle detection sensors ASP-H1, ASP-H2, ASP-V1, and ASP-V2.

As shown in FIG. 6A, each of the angle detection sensors ASP-H1, ASP-H2, ASP-V1, and ASP-V2 has a form in which an area per unit length UL is substantially constant. The unit length UL may be set to a predetermined length.

The first and second angle detection horizontal sensors ASP-H1 and ASP-H2 have a predetermined area per same width. Each of the first and second angle detection horizontal sensors ASP-H1 and ASP-H2 may have a predetermined form, e.g., a stripe form. In another embodiment, the first and second angle detection horizontal sensors ASP-H1 and ASP-H2 may have a different form. For example, in one embodiment, the first and second angle detection horizontal sensors ASP-H1 and ASP-H2 may have a form in which regular patterns are arranged along the first direction DR1.

The first and second angle detection vertical sensors ASP-V1 and VSP-H2 have a predetermined area per same height. The sub detection sensors ASP-V11 and ASP-V12 may be on the same extension line and the sub detection sensor ASP-V21 and ASP-V22 may be on the same extension line.

The first signal line group SL-G1 may include a first signal line SL-G11 corresponding to the first and second angle detection horizontal sensors ASP-H1 and ASP-H2, a second signal line SL-G12 corresponding to the first angle detection vertical sensor ASP-V1, and a third signal line SL-G13 corresponding to the second angle detection vertical sensor ASP-V2. Each of the first to third signals lines SL-G11, SL-G12, and SL-G13 may include first to third lines portions SLP1, SLP2, and SLP3.

The first line portion SLP1 of the first signal line SL-G11 is connected to one end of the first angle detection horizontal sensor ASP-H1. The second line portion SLP2 connects the other end of the first angle detection horizontal sensor ASP-H1 and one end of the second angle detection horizontal sensor ASP-H2. The third line portion SLP3 is connected to the other end of the second angle detection horizontal sensor ASP-H2. At least one of the first line portion SLP1 or the third line portion SLP3 may provide a current value flowing in the first angle detection horizontal sensor ASP H1 or the second angle detection horizontal sensor ASP H2 to the readout circuit 22 (see, e.g., FIG. 3).

The first to third line portions SLP1, SLP2, and SLP3 of the second signal line SL-G12 may connect the sub detection sensors ASP-V11 and ASP-V12 and the readout circuit 22 electrically. The first to third line portions SLP1, SLP2, and SLP3 of the third signal line SL-G13 may connect the sub detection sensors ASP-V21 and ASP-V22 and the readout circuit 22 electrically.

The third signal line group SL-G3 is electrically connected to the first and second angle detection horizontal sensors ASP-H1 and ASP-H2 and the first and second angle detection vertical sensors ASP-V1 and ASP-V2 in order to provide driving voltage. As shown in FIG. 6A, the third signal line group SL-G3 may be connected to each of the second line portions SLP2 of the first to third signals lines SL-G11, SL-G12, and SL-G13.

The first signal line group SL-G1 includes the first to third signals lines SL-G11, SL-G12, and SL-G13. In one embodiment, the first signal line group SL-G1 may include a plurality of signals lines separately connected to each of the first angle detection horizontal sensor ASP-H1, the second angle detection horizontal sensor ASP-H2, the sub detection sensors ASP-V11 and ASP-V12, and the sub detection sensors ASP-V21 and ASP-V22.

The third signal line group SL-G3 includes one signal line that is simultaneously connected to the second line portions SLP2 of the first to third signals lines SL-G11, SL-G12, and SL-G13. According to one embodiment, the third signal line group SL-G3 may include signal lines for providing a driving voltage to each of the first angle detection horizontal sensor ASP-H1, the second angle detection horizontal sensor ASP-H2, the sub detection sensors ASP-V11 and ASP-V12, and the sub detection sensors ASP-V21 and ASP-V22. The signal lines of the third signal ling group SL-G3 may provide the same level of driving voltage to the above-mentioned sensors.

Referring to FIG. 6B, when bending angle is 0°, stress does not occur. The term inner-bending may correspond to the case where the bending angle of the display device DD is a positive value. The term outer-bending may correspond to the case where the bending angle is a negative value.

As the bending angle increases, compressive stress or tensile stress applied to the angle detection sensors ASP-H1, ASP-H2, ASP-V1, and ASP-V2 increases. As compressive stress or tensile stress increases, the resistances of the angle detection sensors ASP-H1, ASP-H2, ASP-V1, and ASP-V2 may increase and the currents flowing in the angle detection sensors ASP-H1, ASP-H2, ASP-V1, and ASP-V2 may decrease.

Figure 7A:
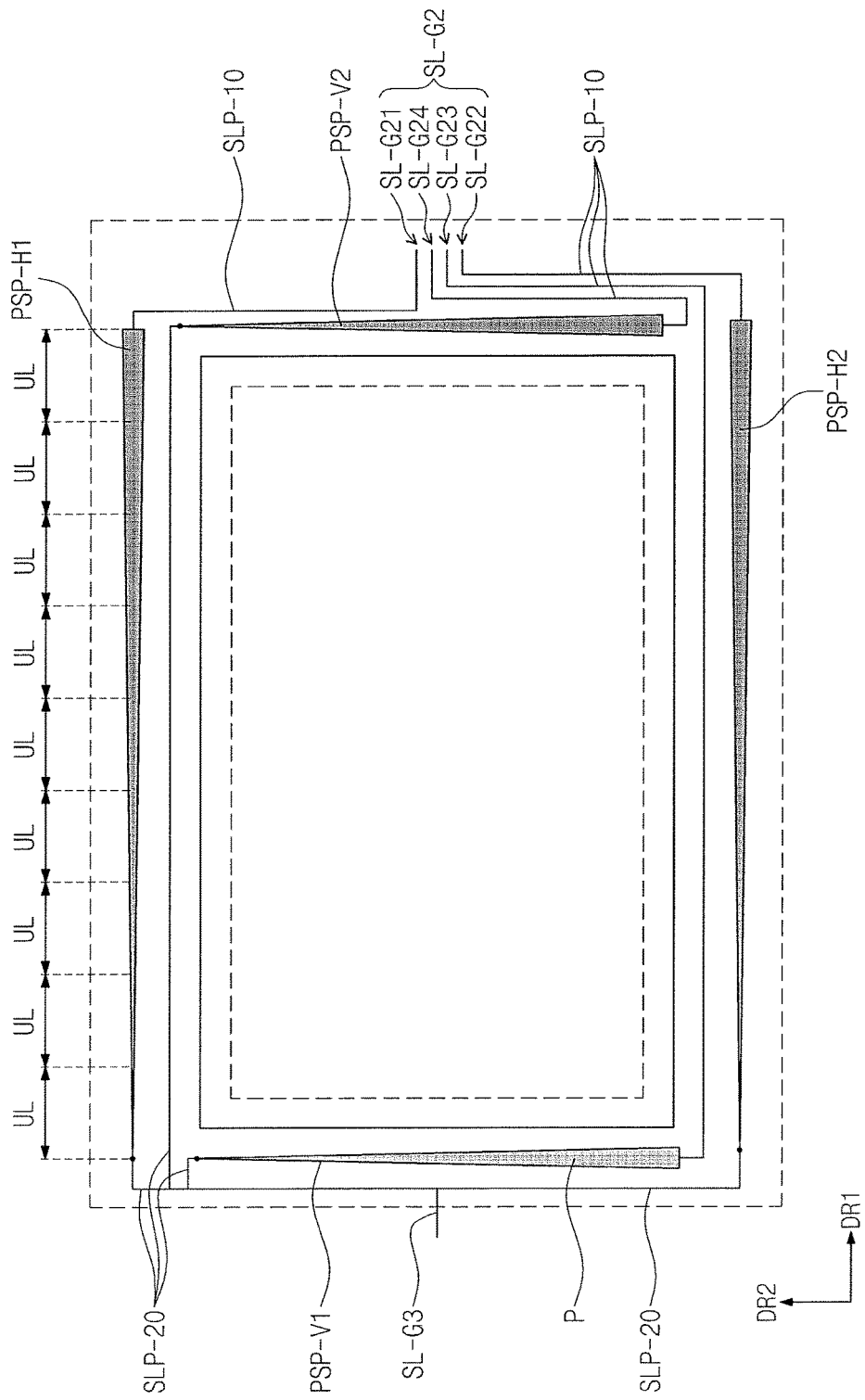
FIG. 7A illustrates an embodiment of a position detection sensor.
Figure 7B:
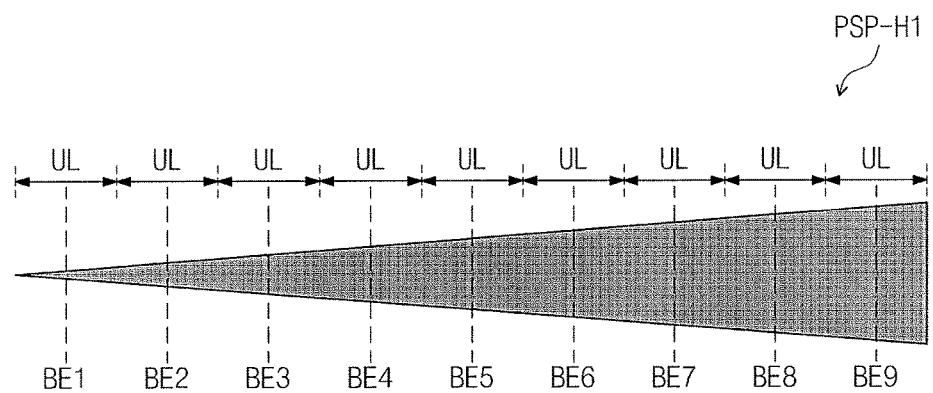
FIG. 7B illustrates an example of bending events occurring from the position detection sensor.
Figure 7C:
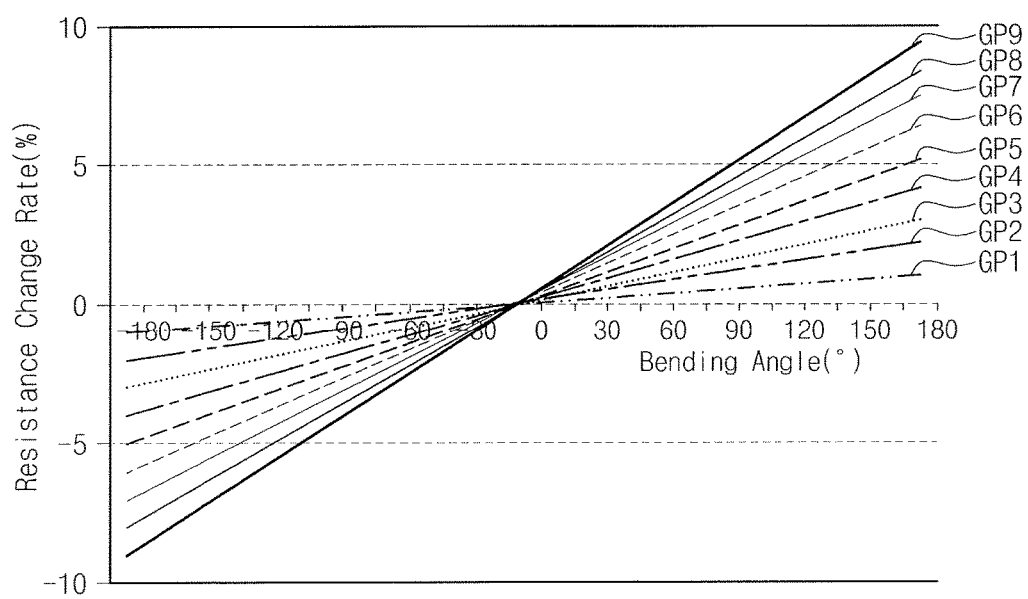
FIG. 7C illustrates an example of a resistance change rate of a position detection sensor according to bending angle and bending position.

FIG. 7A is a plan view illustrating an embodiment of the position detection sensors PSP-H1, PSP-H2, PSP-V1, and PSP-V2, FIG. 7B is a view illustrating an example of bending events occurring from the position detection sensor PSP-H1, and FIG. 7C is a graph illustrating an example of the resistance change rate of the position detection sensors PSP-H1, PSP-H2, PSP-V1, and PSP-V2 according to bending angle and bending position.

As shown in FIG. 7A, each of the position detection sensors PSP-H1, PSP-H2, PSP-V1, and PSP-V2 has a form in which an area per unit length UL is increased along each extended direction. The width of each of the position detection sensors PSP-H1, PSP-H2, PSP-V1, and PSP-V2 may have a form in which the width is increased linearly along each extended direction, e.g., the first direction DR1 or the second direction DR2. FIG. 7A illustrates the position detection sensors PSP-H1, PSP-H2, PSP-V1, and PSP-V2 in an extended triangular form.

According to one embodiment, at least one of the two position detection sensors PSP-H1 and PSP-H2 in FIG. 7A may have a left and right inverted image. At least one of the two position detection sensors PSP-V1 and PSP-V2 may have a up and down inverted form. The first position detection horizontal sensor PSP-H1 and the second position detection horizontal sensor PSP-H2 may have the same form, and the first position detection vertical sensor PSP-V1 and the second position detection vertical sensor PSP-V2 may have the same form as shown in FIG. 7A. However, these sensors may have different forms in another embodiment.

The second signal line group SL-G2 may include first and second signal line SL-G21 and SL-G22 corresponding to the first and second position detection horizontal sensors PSP-H1 and PSP-H2, a third signal line SL-G23 corresponding to the first position detection vertical sensor PSP-V1, and a fourth signal line SL-G24 corresponding to the second position detection vertical sensor PSP-V2. Each of the first to fourth signals lines SL-G21, SL-G22, SL-G23, and SL-24 may include first and second lines portions SLP10 and SLP20.

The first line portion SLP10 of the first signal line SL-G21 is connected to one end of the first position detection horizontal sensor PSP-H1. The second line portion SLP20 connects the other end of the first position detection horizontal sensor PSP-H1 and the signal line of the third signal line group SL-G3. The first line portion SLP10 may provide a current value flowing in the first position detection horizontal sensor PSP-H1 to the readout circuit 22 (see, e.g., FIG. 3).

The first and second line portions SLP10 and SLP20 of the second signal line SL-G22 may electrically connect the second position detection horizontal sensor PSP-H2 to the signal lines of the readout circuit 22 and the third signal line group SL-G3. The first and second line portions SLP10 and SLP20 of the third signal line SL-G23 may electrically connect the first position detection vertical sensor PSP-V1 to the signal lines of the readout circuit 22 and the third signal line group SL-G3. The first and second line portions SLP10 and SLP20 of the fourth signal line SL-G24 may electrically connect the second position detection vertical sensor PSP-V1 to the signal lines of the readout circuit 22 and the third signal line group SL-G3.

In the present embodiment, the second signal line group SL-G2 includes the first to fourth signals lines SL-G21.

SL-G22, SL-G23, and SL-G24. In another embodiment, the second signal line group SL-G2 may have a different number of signal lines. Also, in the present embodiment, the third signal line group SL-G3 is simultaneously connected to the second line portions SLP20 of the first to fourth signal lines SL-G21, SL-G22, SL-G23, and SL-G24. In another embodiment, the third signal line group SL-G3 may include signal lines for providing a driving voltage to each of the first position detection horizontal sensor PSP-H1, the second position detection horizontal sensor PSP-H2, the first position detection vertical sensor PSP-V1, and the second position detection vertical sensor PSP-V2.

FIG. 7B illustrates an example of nine bending events BE1 to BE9 occurring from nine points of the first position detection horizontal sensor PSP-H1. The nine bending events BE1 to BE9 may define nine bending axes. The nine curves GP1 to GP9 in FIG. 7C represent corresponding resistance change rates according to bending angles at the nine points, respectively.

Referring to the nine curves GP1 to GP9, the resistance change rate increases with an increase in the overlapping area of the bending axis and first position detection horizontal sensor PSP-H1 at the same bending angle. As described with reference to FIGS. 6A and 6B, based on resistance change values of the angle detection sensors ASP-H1, ASP-H2, ASP-V1, ASP-V2ASP-H1, ASP-H2, ASP-V1, and ASP-V2, bending angle may be calculated and based on resistance change values of the position detection sensors PSP-H1, PSP-H2, PSP-V1, and PSP-V2, bending position is calculated.

The bending position coordinates of the first direction DR1 may be calculated based on the resistance change value of at least one of the first position detection horizontal sensor PSP-H1 or the second position detection horizontal sensor PSP-H2. The bending position coordinates of the second direction DR2 may be calculated based on a resistance change value of at least one of the first position detection vertical sensor PSP-V1 and the second position detection vertical sensor PSP-V2.

Figure 8A:
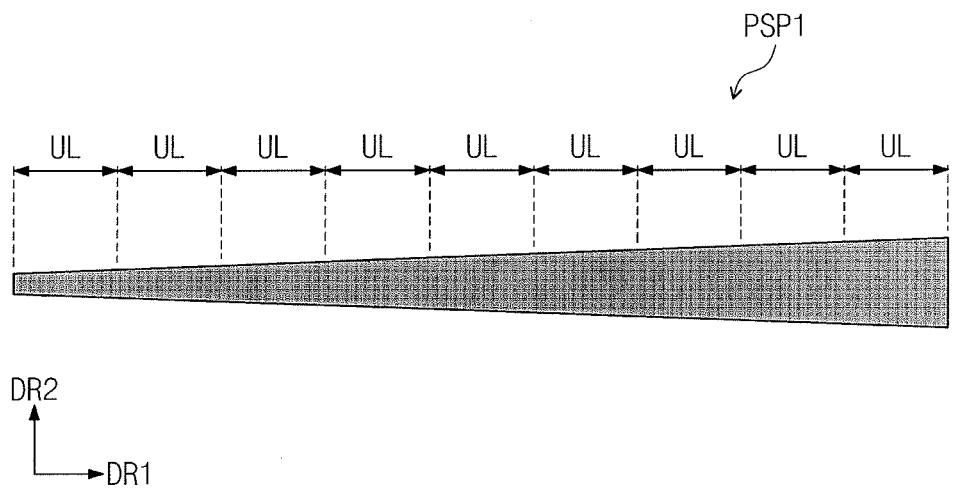
FIGS. 8A to 8C illustrate plan views illustrating embodiments of position detection sensors.
Figure 8B:
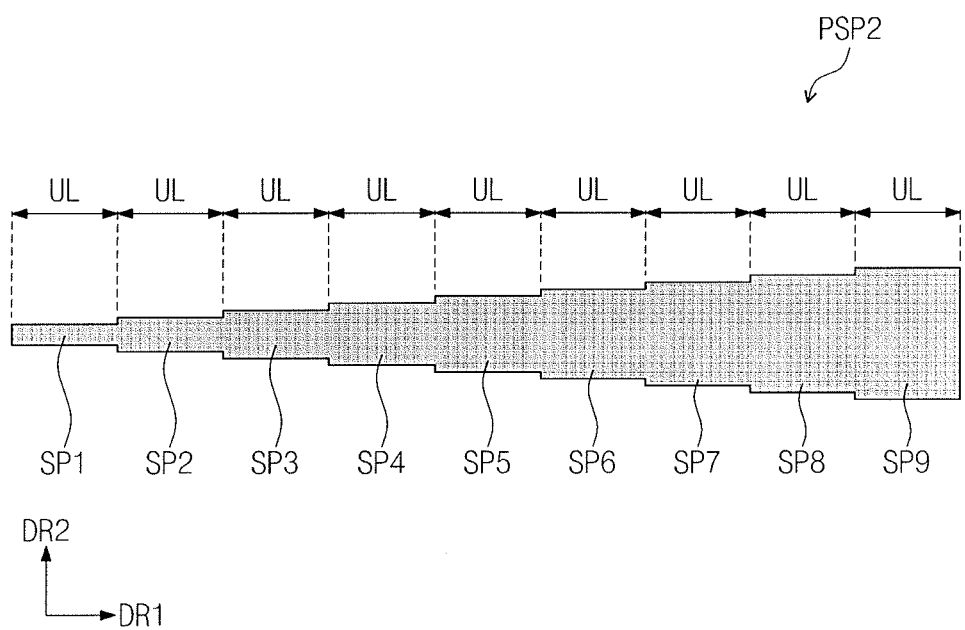
Figure 8C:
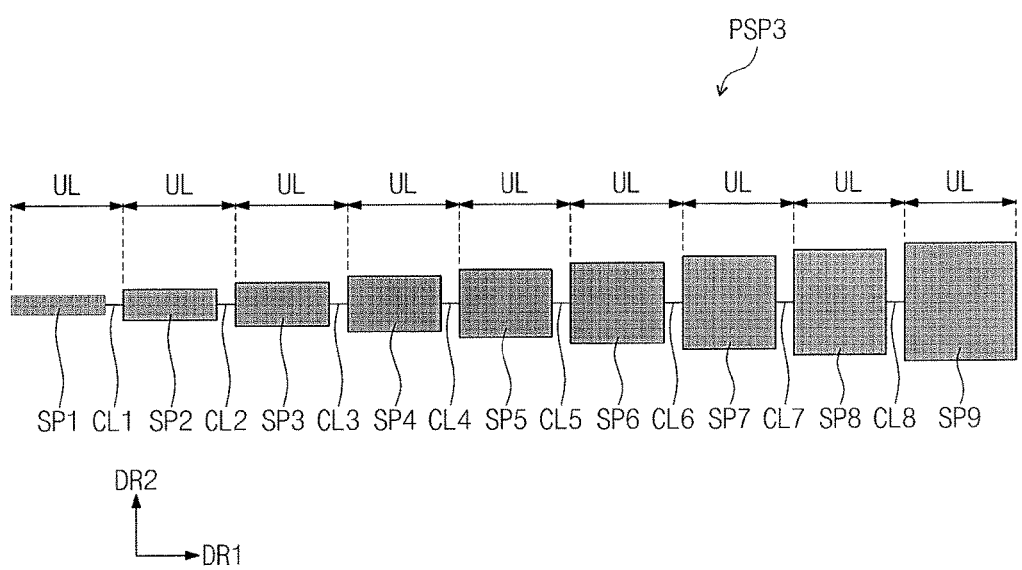

FIGS. 8A to 8C are plan views illustrating an embodiment of position detection sensors PSP1, PSP2, and PSP3. The first position detection horizontal sensor PSP-H1, the second position detection horizontal sensor PSP-H2, the first position detection vertical sensor PSP-V1, and the second position detection vertical sensor PSP-V2 in FIG. 7A may be modified, for example, into the position detection sensors PSP1, PSP2, and PSP3 in forms shown in FIGS. 8A to 8C.

As shown in FIG. 8A, the position detection sensor PSP1 may have an extended trapezoid form extending along the first direction DR1.

As shown in FIG. 8B, the position detection sensor PSP2 may include k sensor portions having different widths (where k is a natural number of two or more). The width may be defined by the shortest length along the second direction DR2. The i+1th sensor portion (where i is a natural number of one or more) among the k sensor portions has a larger width than the ith sensor portion. Each of the k sensor portions may have the same width regardless of an area. The first sensor portion, among the k sensor portions, may have the smallest width and the kth sensor portion may have the largest width. The k sensor portions having different widths may have an integrated form. FIG. 8B illustrates position detection sensor PSP2 including nine sensor portions SP1 to SP9 as an example.

As shown in FIG. 8C, the position detection sensor PSP3 may include k sensor portions having different areas (where k is a natural number of two or more) and connection lines electrically connecting adjacent sensor portions. The k sensor portions may have the same length in the first direction DR1. The i+1th sensor portion (where i is a natural number of one or more) among the k sensor portions has a larger area than the ith sensor portion. The first sensor portion among the k sensor portions may have the smallest area and the kth sensor portion may have the largest area. FIG. 8C illustrates position detection sensor PSP3 including nine sensor portions SP1 to SP9 and eight connection lines CL1 to CL8 as an example. The connection lines CL1 to CL8 may include a material selected from the materials for forming the signal line SL (see, e.g., FIG. 3) and may include the same material as the signal line SL.

Figure 9:
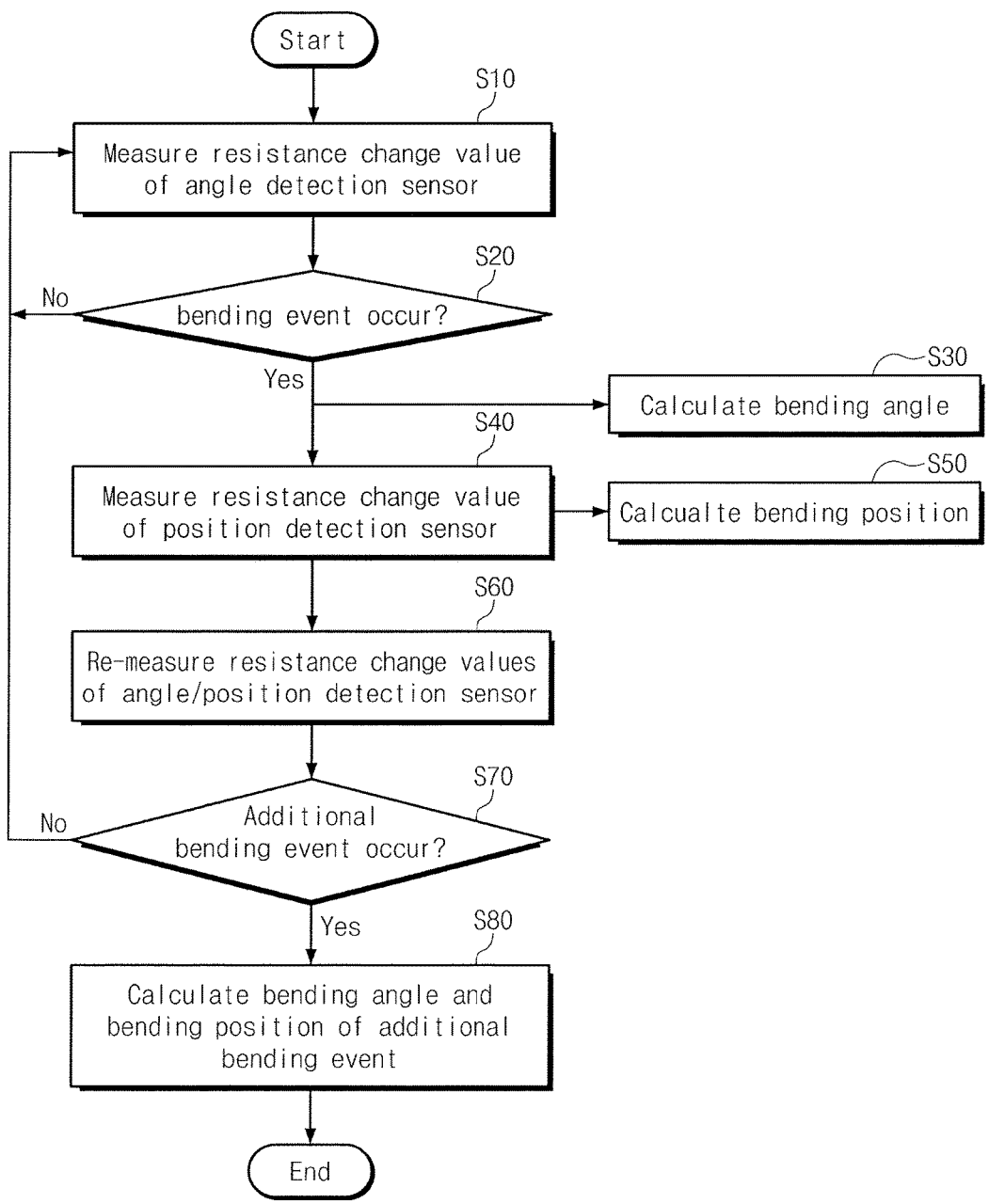
FIG. 9 illustrates an embodiment of a method for driving a display device.
Figure 10:
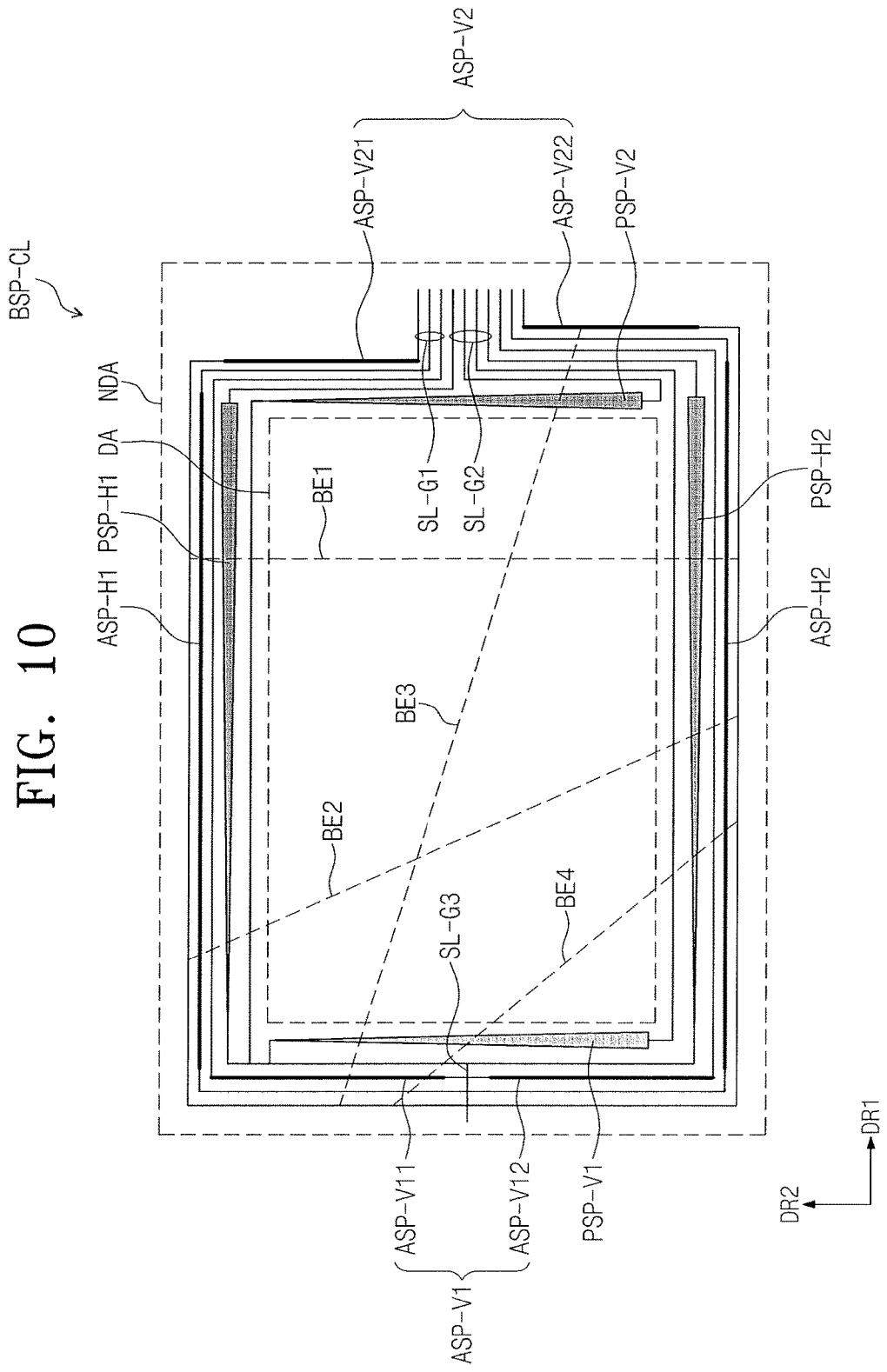
FIG. 10 illustrates examples of bending events occurring from a display device.
Figure 11:
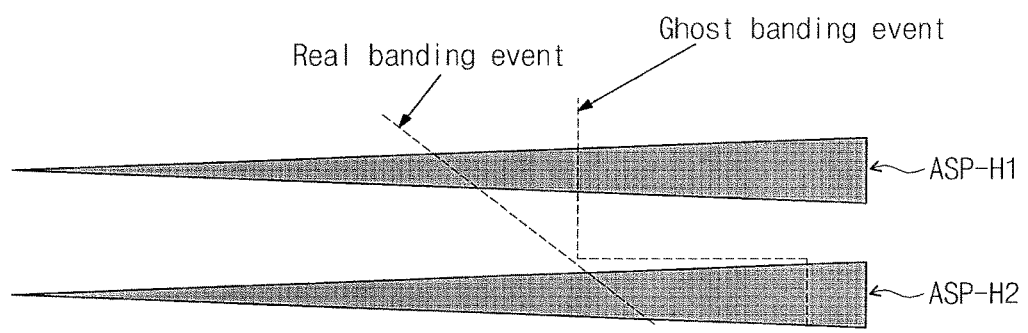
FIG. 11 illustrates an embodiment of a method for distinguishing a ghost bending event from a real bending event.

FIG. 9 illustrates an embodiment of a method for driving a display device. FIG. 10 is a plan view illustrating an example of a plurality of bending events of the display device. FIG. 11 illustrates an embodiment of a method for distinguishing a ghost bending event from a real bending event. An embodiment of the driving method of a display device (that is, a bending detection method) may therefore described with reference to FIGS. 9 to 11.

Before a bending event occurs, a bending detection screen BSP may operate in a calibration mode. In one embodiment, the bending detection screen BSP is set to an optimal state for detecting a bending event.

Resistance changes values (e.g., first resistance change values) of the angle detection sensors ASP-H1, ASP-H2, ASP-V1, and ASP-V2 are measured in operation S10. The current detection unit 20 (see, e.g., FIG. 3) reads current values flowing in the angle detection sensors ASP-H1, ASP-H2, ASP-V1, and ASP-V2 and converts the read current values into the first resistance change values. The current detection unit 20 provides the first resistance change values to the calculation unit 30 (see, e.g., FIG. 3). The first resistance change values may be provided as the absolute value of a changed resistance or a resistance change rate (%).

Whether a bending event occurs is determined based on the measured first resistance change values in operation S20. When the measured first resistance change values are greater than a reference value, the calculation unit 30 determines that a bending event is occurring or has occurred. At this point, it is determined that an occurring bending axis overlaps sensors where a resistance change is measured among the angle detection sensors ASP-H1, ASP-H2, ASP-V1, and ASP-V2. The bending event may be, for example, one of four bending events shown in FIG. 10.

When it is determined that a bending event occurs, a bending angle is calculated in operation S30. The calculation unit 30 may read a bending angle corresponding to the received first resistance change values from a look-up table.

Additionally, when it is determined that a bending event occurs, resistance change values (e.g., second resistance change values) of the position detection sensors PSP-H1, PSP-H2, PSP-V1, and PSP-V2 are measured in operation S40. The current detection unit 20 (see, e.g., FIG. 3) reads current values flowing in the position detection sensors PSP-H1, PSP-H2, PSP-V1, and PSP-V2 and converts the read current values into second resistance change values. The current detection unit 20 provides measured second resistance change values to the calculation unit 30. When it is determined that a bending event has not occurred, the first resistance change values are measured again in operation S10.

A bending position is calculated in operation S50 based on the first resistance change values and the second resistance change values. The calculation unit 30 may determine a bending angle based on the received first resistance change values and read a bending position from a look-up table based on the second resistance change values. The method of calculating a bending position may correspond, for example, to the approach in FIG. 7C.

Then, the first resistance change values and the second resistance change values are measured again in operation S60. The current detection unit 20 reads current values flowing in the angle detection sensors ASP-H1, ASP-H2, ASP-V1, and ASP-V2 and reads the current values flowing in the position detection sensors PSP-H1, PSP-H2, PSP-V1, and PSP-V2. The current detection unit 20 provides the re-measured first and second resistance change values to the calculation unit 30. According to one embodiment, after the bending position is calculated in operation S50, the method may be terminated immediately, e.g., without re-measuring the first and second change values.

Whether an additional bending event occurs is determined in operation S70 based on the re-measured first and second resistance change values. The calculation unit 30 compares the re-measured first and second resistance change values with previously measured first and second resistance change values.

When a comparison result is within a reference range, it is determined that an additional event has not occurred. When it is determined that an additional event has not occurred, the first resistance change values are measured again in operation S10.

When the comparison result is within the reference range, it is determined that an additional event occurs. When it is determined that an additional bending event occurs, the bending angle and bending position of the additional bending event are calculated in operation S80.

A difference value (e.g., a first difference value) between re-measured first resistance change values and previously measured first resistance change values may be calculated and a difference value (e.g., a second difference value) between re-measured second resistance change values and previously measured second resistance change values may be calculated. The bending angle of the additional bending event may be calculated based on the first difference value. The bending position of the additional bending event may be calculated based on the first difference value and the second difference value.

FIG. 11 illustrates an embodiment of a method for distinguishing a ghost bending event from a real bending event. By simultaneously measuring a resistance change value of each of the first position detection horizontal sensor PSP-H1, the second position detection horizontal sensor PSP-H2, the first position detection vertical sensor PSP-V1, and the second position detection vertical sensor PSP-V2, a real bending event may be distinguished from a ghost bending event.

When a first bending event BE1 occurs among the four bending events in FIG. 10, the same resistance change values are simultaneously measured from the first position detection horizontal sensor PSP-H1 and the second position detection horizontal sensor PSP-H2. When a second bending event BE2 among the four bending events in FIG. 10 or the real bending event of FIG. 11 occurs, different resistance change values are simultaneously measured from the first position detection horizontal sensor PSP-H1 and the second position detection horizontal sensor PSP-H2.

When different bending axes are respectively defined in the first position detection horizontal sensor PSP-H1 and the second position detection horizontal sensor PSP-H2, or a bending axis extending in a diagonal direction is simultaneously defined in the first position detection horizontal sensor PSP-H1 and the second position detection horizontal sensor PSP-H2, different resistance change values may be measured from the first position detection horizontal sensor PSP-H1 and the second position detection horizontal sensor PSP-H2. In this embodiment, since two bending events do not occur substantially simultaneously, a ghost bending event may be distinguished from a real bending event.

Moreover, a resistance change value of the first position detection horizontal sensor PSP-H1 and a resistance change value of the second position detection horizontal sensor PSP-H2, which are shown when a bending axis extending in a diagonal direction is simultaneously defined in the first position detection vertical sensor PSP-V1 and the second position detection vertical sensor PSP-V2, may be stored in a look-up table.

Figure 12:
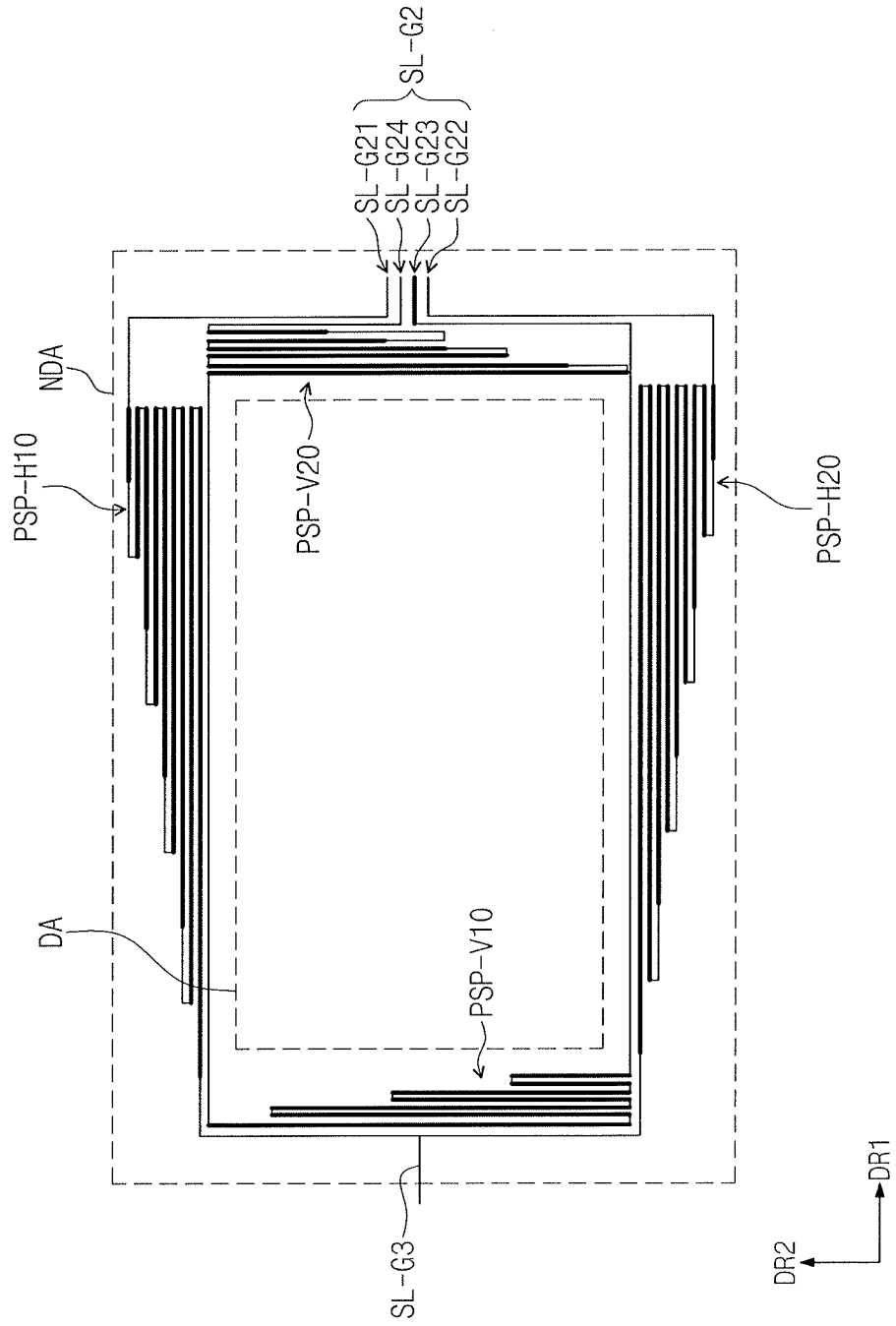
FIG. 12 illustrates another embodiment of a position detection sensor.
Figure 13A:
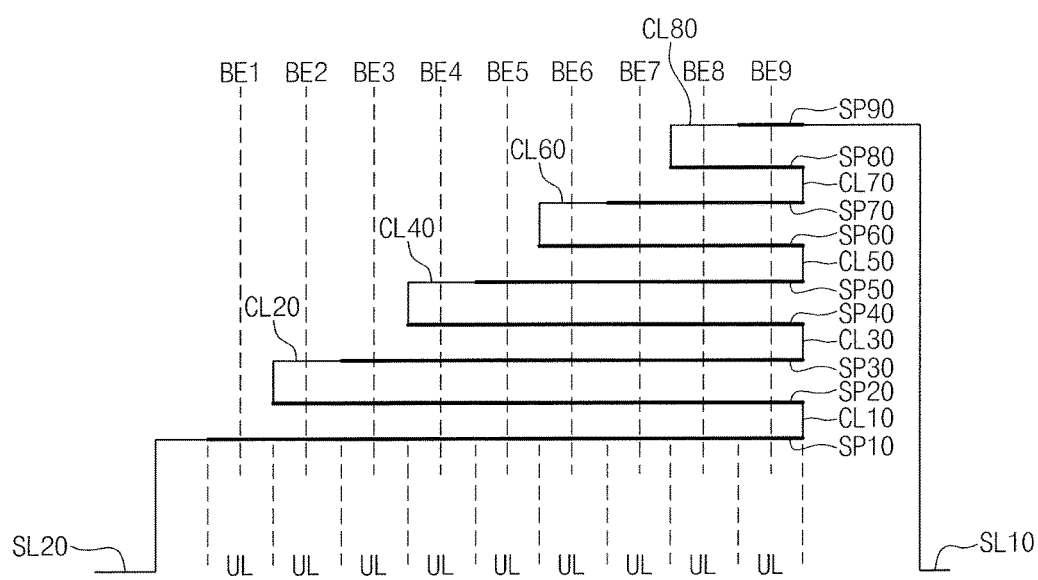
FIG. 13A illustrates another embodiment of a position detection sensor and FIG. 13B illustrates an example of stress applied points occurring from the position detection sensor according to the positions of bending events.
Figure 13B:
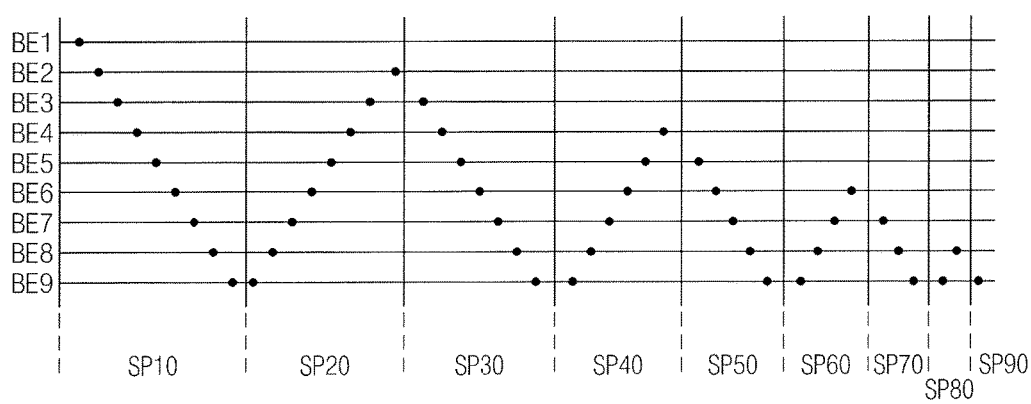

FIG. 12 is a plan view illustrating an arrangement of position detection sensors PSP-H10, PSP-H20, PSP-V10, and PSP-V20. FIG. 13A is an enlarged plan view of an embodiment of a position detection sensor PSP-H10. FIG. 13B illustrates an example of stress applied points occurring from the position detection sensor PSP-H10 according to the positions of bending events. The position detection sensors PSP-H10, PSP-H20, PSP-V10, and PSP-V20 are described with reference to FIGS. 12 to 13B for illustrative purposes.

As shown in FIG. 12, each of the position detection sensors PSP-H10, PSP-H20, PSP-V10, and PSP-V20 has a form in which an area per unit length UL is increased along each extended direction. The first position detection horizontal sensor PSP-H10 and the second position detection horizontal sensor PSP-H20 have the up and down inverted form and the first position detection vertical sensor PSP-V1 and the second position detection vertical sensor PSP-V2 have the left and right inverted form as illustrated in FIG. 12. However, the sensors may be arranged to have a different form in another embodiment.

The position detection sensors PSP-H10, PSP-H20, PSP-V10, and PSP-V20 are described in more detail with reference to the first position detection horizontal sensor PSP-H10 shown in FIG. 13A. The first position detection horizontal sensor PSP-H10 may include k sensor portions having different lengths (where k is a natural number of two or more) and k−1 connection lines. FIG. 13A illustrates that the first position detection horizontal sensor PSP-H10 includes nine sensor portions SP10 to SP90 and eight connection lines CL10 to CL80 as an example.

The k sensor portions may be arranged in a direction (for example, the second direction DR2 of FIG. 13A) intersecting a length direction (for example, the first direction DR1 of FIG. 13A). At this point, one end of the k sensor portions may be arranged on a reference line RL. As shown in FIG. 13A, the right ends of the k sensor portions may be arranged on the reference line RL.

Each of the k sensor portions includes a pressures detection material. In relation to each of the k sensor portions, an area per unit length may be constant substantially. The first sensor portion among the k sensor portions may have the smallest length and the kth sensor portion may have the largest length. The k sensor portions may be increased by a predetermined length in a direction from the first sensor portion toward the kth sensor portion.

The ith connection line (where i is an odd natural number of one or more) among the k−1th connection lines may connect one end of the ith sensor portion among the k sensor portions and one end of the i+1th sensor portion. The i+1th connection line may connect the other end of the i+1th sensor portion and one end of the i+2th sensor portion. For example, the first connection line SL10 connects the right one end of the first sensor portion SP10 and the right one end of the second sensor portion 20. The second connection line SL20 connects the left end of the second sensor portion SP20 and the left one end of the third sensor portion SP30.

The k−1th connection lines may include a high conducive material, for example, gold, silver, copper, aluminum, and alloys thereof. The k−1 connection lines may include a material selected from the materials for forming the signal line SL (see, e.g., FIG. 3) and may include the same material as the signal line SL.

As shown in FIG. 13B, the nine bending events BE1 to BE9 may define each bending axis. According to the first bending event BE1, a point where stress is applied to only the first sensor portion SP10 occurs. A point where stress is applied as it approaches toward the second to ninth bending events BE2 to BE9 is increased. That is, according to the nine bending events BE1 to BE9, resistance change values occurring from the first position detection horizontal sensor PSP-H10 are different from each other. Thus, bending positions may be distinguished according to the first direction DR1 of the nine bending events BE1 to BE9.

Figure 14A:
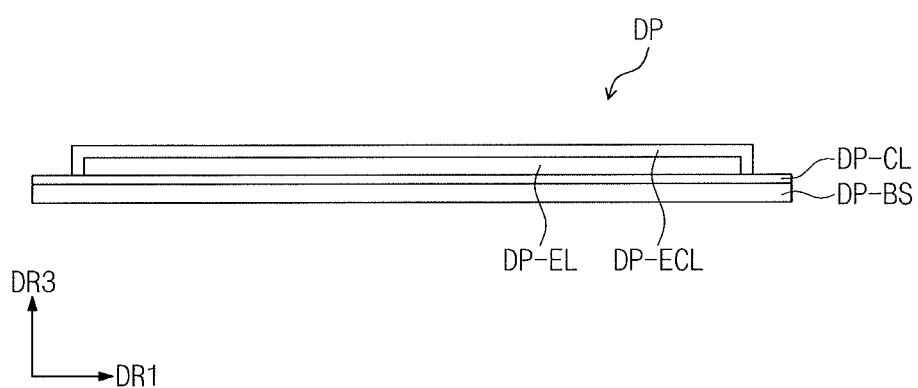
FIG. 14A illustrates an embodiment of a display panel and FIG. 14B illustrates another embodiment of a display panel.
Figure 14B:
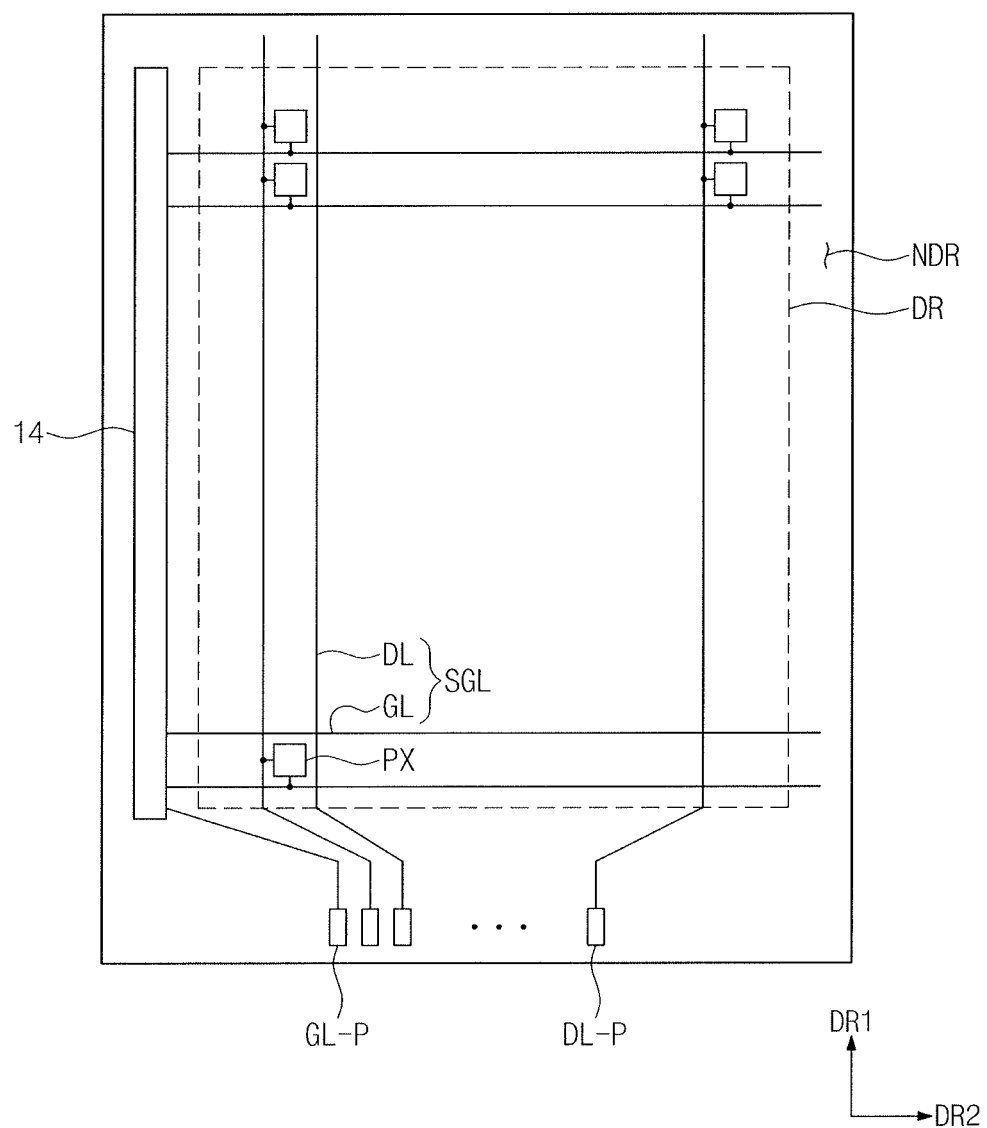

FIG. 14A is a sectional view of an embodiment of a display panel DP, and FIG. 14B is a plan view of the display panel DP. The display panel DP may be, for example, an organic light emitting display panel.

As shown in FIG. 14A, the display panel DP includes a base member DP-BS, a circuit layer DP-CL, a device layer DP-EL, and a sealing layer DP-ECL. The display panel DP may further include an optical member on the sealing layer DP-ECL, for example, a phase delay plate and a polarizing plate.

The base member DP-BS may include at least one plastic film. In one embodiment, the base member DP-BS includes two plastic films, and an organic layer, a silicon nitride layer, and/or a silicon oxide layer between the two plastic films. The base member DP-BS may include, for example, at least one of Polyimide (PI), Polyethyleneterephthalate (PET), Polyethylenenaphthalate (PEN), Polyethersulphone (PES), and Fiber reinforced plastics (FRP).

The circuit layer DP-CL includes a plurality of signal lines SGL and electronic devices in the display panel DP. Additionally, the circuit layer DP-CL includes a plurality of insulation layers for insulating the signal lines SGL from components of electronic devices.

As shown in FIGS. 14A and 14B, the circuit layer DP-CL may include a plurality of signal lines SGL. The signal lines SGL may include gate lines GL extending along the first direction axis DR1 and data lines DL extending along the second direction axis DR2. The gate lines GL and the data lines DL are respectively connected to corresponding pixels PX. The circuit layer DP-CL may include circuits of a pixel PX, for example, at least one thin film transistor and at least one capacitor. The circuit layer DP-CL may include a gate driver 14 at one side of the non-display area NDA.

The gate lines GL and the data lines DL may respectively include a gate pad part GL-P and data pad parts DL-P in the non-display area NDA. The gate pad part GL-P and the data pad parts DL-P may be connected to a flexible circuit board.

A device layer DP-EL includes a light emitting device, e.g., an organic light emitting diode. The device layer DP-EL may further include one or more electronic devices for assisting (e.g., controlling current to) the organic light emitting diode.

The sealing layer DP-ECL seals the device layer DP-EL. The device layer DP-EL may include a thin film encapsulation layer (TFE), which, for example, may include a plurality of inorganic thin layers and a plurality of organic thin layers. In one embodiment, the sealing layer DP-ECL may be replaced with a sealing substrate. The sealing substrate is spaced apart from the base member DP-BS with the device layer DP-EL therebetween. Sealant forms a predetermined space along the outlines of the sealing substrate and the base member DP-BS.

Referring to FIG. 4, the base member BSP-BS of the bending detection screen BSP may be on the sealing layer DP-ECL or the sealing substrate. According to one embodiment, the base member BSP-BS of the bending detection screen BSP in FIG. 4 may be omitted or the conductive layer BSP-CL of the bending detection screen BSP may be directly disposed on the display panel DP, e.g., the sealing layer DP-ECL or the sealing substrate. For example, the angle detection sensors ASP-H1, ASP-H2, ASP-V1, and ASP-V2, the position detection sensors PSP-H1, PSP-H2, PSP-V1, and PSP-V2, and the signal lines SL-G1, SL-G2, and SL-G3 in FIG. 5 may be directly disposed on the sealing layer DP-ECL or the sealing substrate. At this point, one surface of the sealing layer DP-ECL or one surface of the sealing substrate may be defined as a base surface provided from the display panel DP.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The sensors, calculators, measuring devices, calculation and other units, controllers, and other processing features of the embodiments may be implemented in logic which, for example, may include hardware, software, or both. When implemented at least partially in hardware, the sensors, calculators, measuring devices, units, controllers, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the sensors, calculators, measuring devices, units, controllers, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

By way of summation and review, the bending angle of a flexible display device may be detected. Additionally, the bending position of a flexible display device may be detected. Since the structure of an angle detection sensor and a position detection sensor is relatively simple, manufacturing may be easy perform and the occurrence of defects such as short circuits between detection sensors and short circuits between signal lines may be reduced. Various applications may be executed by detecting a bending angle and a bending position.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present embodiment set forth in the claims.

What is claimed is:

1. A flexible display device, comprising:
a flexible display panel to generate an image; and
a bending detection screen to detect a bending angle and a bending position, wherein the bending detection screen includes:
an angle detection resistive sensor having an area per unit length that is substantially constant on a base surface;
a position detection resistive sensor having an area per unit length that increases along a length direction on the base surface such that a slope of a resistance change rate of the position detection resistive sensor according to the bending angle increases along the length direction;
signal lines connected to the angle and position detection resistive sensors; and
a bending detection circuit configured to detect resistance change values of the angle detection resistive sensor and the position detection resistive sensor in correspondence to an applied stress.

2. The flexible display device as claimed in claim 1, wherein the angle detection resistive sensor includes:
an angle detection horizontal resistive sensor extending in a first direction; and
an angle detection vertical resistive sensor extending in a second direction intersecting the first direction.

3. The flexible display device as claimed in claim 2, wherein:
the angle detection horizontal resistive sensor includes first and second angle detection horizontal resistive sensors, each of the first and the second angle detection horizontal resistive sensors extending in the first direction and wherein the first and the second angle detection horizontal resistive sensors spaced apart from each other in the second direction; and
the angle detection vertical resistive sensor includes first and second angle detection vertical resistive sensors, each of the first and the second angle detection vertical resistive sensors extending in the second direction and the first and the second angle detection vertical resistive sensors spaced apart from each other in the first direction.

4. The flexible display device as claimed in claim 3, wherein:
each of the first and second angle detection vertical resistive sensors includes a first sub detection resistive sensor and a second sub detection resistive sensor,
each of the first sub detection resistive sensor and the second sub detection resistive sensor extends in the second direction, and
the first sub detection resistive sensor and the second sub detection resistive sensor are spaced apart from each other in the second direction.

5. The flexible display device as claimed in claim 3, wherein the signal lines includes:
at least one first signal line to provide a driving voltage to the first and second angle detection horizontal resistive sensors and the first and second angle detection vertical resistive sensors; and
second signal lines respectively connected to the first and second angle detection horizontal resistive sensors and the first and second angle detection vertical resistive sensors.

6. The flexible display device as claimed in claim 2, wherein:
the position detection resistive sensor includes first and second position detection horizontal resistive sensors, each of the first and second position detection horizontal resistive sensors extending in the first direction, the first and second position detection horizontal resistive sensors spaced apart from each other in the second direction; and
first and second position detection vertical resistive sensors, each of the first and second position detection vertical resistive sensors extending in the second direction, the first and second position detection vertical resistive sensors spaced apart from each other in the first direction.

7. The flexible display device as claimed in claim 6, wherein the signal lines include:
at least one first signal line to provide a driving voltage to the first and second position detection horizontal resistive sensors and the first and second position detection vertical resistive sensors; and
second signal lines respectively connected to the first and second position detection horizontal resistive sensors and the first and second position detection vertical resistive sensors.

8. The flexible display device as claimed in claim 7, wherein the first signal line is commonly connected to ends of the first and second position detection horizontal resistive sensors and the first and second position detection vertical resistive sensors.

9. The flexible display device as claimed in claim 6, wherein a width of the first position detection horizontal resistive sensor increases linearly in the first direction.

10. The flexible display device as claimed in claim 6, wherein the first horizontal detection resistive sensor includes an ith sensor portion, an i+1th sensor portion having a larger area than the ith sensor portion, and connection lines connecting the ith sensor portion and the i+1th sensor portion.

11. The flexible display device as claimed in claim 6, wherein the first position detection horizontal resistive sensor includes:
k sensor potions having different lengths from each other in the first direction and arranged in the second direction, and
k−1 connection lines connecting the k sensor portions, wherein ends of the k sensor portions are arranged on a reference line; and an ith connection line among the k−1 connection lines connects an end of an ith sensor portion among the k sensor portions and an end of an i+1th sensor portion, and an i+1th connection line among the k−1 connection lines connects the other end of the i+1th sensor portion among the k sensor portions and one end of an i+2th sensor portion.

12. The flexible display device as claimed in claim 11, wherein each of the k sensor portions has an area per unit length that is substantially constant.

13. The flexible display device as claimed in claim 1, wherein the bending detection screen includes a flexible base member having the base surface.

14. The flexible display device as claimed in claim 13, wherein the angle detection resistive sensor, the position detection resistive sensor, and the signal lines are on a same surface.

15. The flexible display device as claimed in claim 1, wherein the display panel provides the base surface, and the angle detection resistive sensor, the position detection resistive sensor, and the signal lines are on a same surface.

16. The flexible display device as claimed in claim 1, further comprising:
a window to provide an input surface of an input device, wherein the window includes a black matrix partially overlapping a base.

17. The flexible display device as claimed in claim 16, wherein the angle detection resistive sensor, the position detection resistive sensor, and the signal lines overlap the black matrix.

18. A method for driving a display device, the method comprising:
measuring a resistance change value of an angle detection resistive sensor, the angle detection resistive sensor including a material with a resistance that changes in correspondence to intensity of an applied stress and having an area per unit length that is substantially constant;
measuring a resistance change value of a position detection resistive sensor, the position detection resistive sensor including a material with a resistance that changes in correspondence to intensity of the applied stress and having an area per unit length that is increased along a length direction such that a slope of a resistance change rate of the position detection resistive sensor according to the bending angle increases along the length direction;
calculating a bending angle of a bending event based on the resistance change value of the angle detection resistive sensor; and
calculating a bending position of the bending event based on the resistance change value of the angle detection resistive sensor and a resistance change value of the position detection resistive sensor.

19. The method as claimed in claim 18, further comprising:
re-measuring the resistance change values of the angle detection resistive sensor and the position detection resistive sensor;
determining an occurrence of an additional bending event based on the re-measured resistance change values; and
calculating a bending angle and a bending position of an additional bending event based on the re-measured resistance change values.

20. The method as claimed in claim 18, wherein:
the position detection resistive sensor includes
first and second position detection horizontal resistive sensors, each of the first and second position detection horizontal resistive sensors extending in a first direction and the first and second position detection horizontal resistive sensors spaced in a second direction intersecting the first direction; and
first and second position detection vertical resistive sensors, each of the first and second position detection vertical resistive sensors extending in the second direction and the first and second position detection vertical resistive sensors spaced apart from each other in the first direction, and
the method includes measuring of the resistance change value of the position detection resistive sensor includes simultaneously measuring resistance change values of the first and second position detection horizontal resistive sensors and the first and second position detection vertical resistive sensors.

* * * * *